(12) United States Patent
Mitsuishi et al.

(10) Patent No.: US 8,937,328 B2
(45) Date of Patent: Jan. 20, 2015

(54) LIGHT EMITTING DEVICE AND MANUFACTURING METHOD THEREOF

(75) Inventors: Iwao Mitsuishi, Tokyo (JP); Yumi Fukuda, Tokyo (JP); Aoi Okada, Tokyo (JP); Naotoshi Matsuda, Kanagawa (JP); Shinya Nunoue, Chiba (JP); Keiko Albessard, Kanagawa (JP); Masahiro Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/214,410

(22) Filed: Aug. 22, 2011

(65) Prior Publication Data

US 2012/0043573 A1    Feb. 23, 2012

(30) Foreign Application Priority Data

Aug. 23, 2010   (JP) ................ 2010-186548
Aug. 16, 2011   (JP) ................ 2011-177804

(51) Int. Cl.
*H01L 33/00*    (2010.01)
*H01L 21/44*    (2006.01)
(Continued)

(52) U.S. Cl.
CPC .......... *H01L 33/504* (2013.01); *C09K 11/0883* (2013.01); *C09K 11/7734* (2013.01);
(Continued)

(58) Field of Classification Search
CPC ....... H01L 33/486; H01L 33/54; H01L 33/56; H01L 33/53; H01L 33/60; H01L 33/20; H01L 33/62; H01L 33/64; H01L 33/647; H01L 33/44; H01L 33/48; H01L 2924/12014; H01L 2924/0002; H01L 2933/005; H01I 21/76244; H01I 21/76232; H01I 21/76229; H01I 21/76
USPC ............. 257/98, 89, 95, 40, 81, 99, 418, 746, 257/100, E33.073, E33.032, E21.499, 257/E33.057, E33.055, E33.056, E33.068, 257/E23.067, E23.01; 438/667, 678, 614, 438/666, 17, 598, 127, 22, 455, 456, 458, 438/45

See application file for complete search history.

(56) References Cited

U.S. PATENT DOCUMENTS 7,884,538 B2   2/2011   Mitsuishi et al.
7,915,630 B2 *  3/2011   Hattori et al. ............... 257/98

(Continued)

FOREIGN PATENT DOCUMENTS

JP   2005-311395   11/2005
JP   2007-273562   10/2007
(Continued)

OTHER PUBLICATIONS

Office Action issued Jan. 17, 2012 in Japanese Patent Application No. 2011-177804 (with English translation).
(Continued)

*Primary Examiner* — Julio J Maldonado
*Assistant Examiner* — Moazzam Hossain
(74) *Attorney, Agent, or Firm* — Oblon, Spivak, McClelland, Maier & Neustadt, L.L.P.

(57) ABSTRACT

A light emitting device includes a light emitting element that emits light having a wavelength of 250 nm to 500 nm and a fluorescent layer that is disposed on the light emitting element. The fluorescent layer includes a phosphor having a composition expressed by the equation, $((M_{1-x1}Eu_{x1})_{3-y}Si_{13-z}Al_{3+z}O_{2+u}N_{21-w})$, and an average particle diameter of 12 μm or more, wherein in the equation, M is an element that is selected from IA group elements, IIA group elements, IIIA group elements, IIIB group elements except Al, rare-earth elements, and IVB group elements, and x1, y, z, u, and w satisfy each of the inequalities simultaneously, that is to say each of the following inequalities is satisfied by the choice of values of the identified paramaters within the noted ranges of $0<x1<1$, $-0.1<y<0.3$, $-3<z\leq1$, $-3<u-w\leq1.5$, $2<u$, $w<21$.

6 Claims, 19 Drawing Sheets

(51) Int. Cl.
  *H01L 33/50* (2010.01)
  *C09K 11/08* (2006.01)
  *C09K 11/77* (2006.01)
  *H01L 25/075* (2006.01)
  *H01L 33/54* (2010.01)

(52) U.S. Cl.
  CPC .......... *H01L25/0753* (2013.01); *H01L 33/507* (2013.01); *H01L 33/54* (2013.01); *H01L 2933/0041* (2013.01); *H01L 2224/45144* (2013.01); *H01L 2224/48091* (2013.01)
  USPC ........ 257/98; 257/100; 257/99; 257/E33.073; 257/E33.055; 257/E21.499; 438/667; 438/127; 438/22; 438/459; 438/666; 313/483; 313/498; 313/500

(56) References Cited

U.S. PATENT DOCUMENTS

| | | | |
|---|---|---|---|
| 7,935,978 B2 | 5/2011 | Mitsuishi et al. | |
| 2007/0145884 A1* | 6/2007 | Wu et al. | 313/503 |
| 2007/0228390 A1 | 10/2007 | Hattori et al. | |
| 2009/0072195 A1 | 3/2009 | Fukuda et al. | |
| 2009/0096361 A1 | 4/2009 | Fukuda et al. | |
| 2009/0236963 A1 | 9/2009 | Nagatomi et al. | |
| 2010/0025632 A1 | 2/2010 | Fukuda et al. | |
| 2010/0051988 A1 | 3/2010 | Mitsuishi et al. | |
| 2010/0102340 A1 | 4/2010 | Ooya et al. | |
| 2010/0102707 A1 | 4/2010 | Fukuda et al. | |
| 2011/0177635 A1 | 7/2011 | Mitsuishi et al. | |
| 2011/0204769 A1 | 8/2011 | Fukuda et al. | |
| 2011/0220919 A1 | 9/2011 | Okada et al. | |
| 2013/0001628 A1* | 1/2013 | Yamakawa et al. | 257/98 |

FOREIGN PATENT DOCUMENTS

| | | |
|---|---|---|
| JP | 2008-027999 | 2/2008 |
| JP | 2008-041841 | 2/2008 |
| JP | 2008-041843 | 2/2008 |
| JP | 2010-31201 | 2/2010 |
| JP | 2010-56277 | 3/2010 |
| JP | 2010-106127 | 5/2010 |
| WO | WO 2006/093298 A1 | 9/2006 |
| WO | WO2006/106883 A1 | 10/2006 |
| WO | WO 2008/038691 | 4/2008 |

OTHER PUBLICATIONS

Office Action issued Sep. 20, 2011 in Japanese Application No. 2011-177804 filed Aug. 16, 2011.
U.S. Appl. No. 13/037,635, filed Mar. 1, 2011, Okada.
U.S. Appl. No. 13/034,137, filed Feb. 24, 2011, Mitsuishi.
U.S. Appl. No. 13/033,917, filed Feb. 24, 2011, Mitsuishi.
U.S. Appl. No. 13/033,960, filed Feb. 24, 2011, Mitsuishi.
U.S. Appl. No. 13/034,120, filed Feb. 24, 2011, Mitsuishi.
U.S. Appl. No. 13/039,082, filed Mar. 2, 2011, Kato.
U.S. Appl. No. 13/216,860, filed Aug. 24, 2011, Fukuda.
U.S. Appl. No. 13/033,954, filed Feb. 24, 2011, Mitsuishi, et al.
Office Action issued Sep. 2, 2014 in Japanese Patent Application No. 2012-093748 (with English Translation).

* cited by examiner

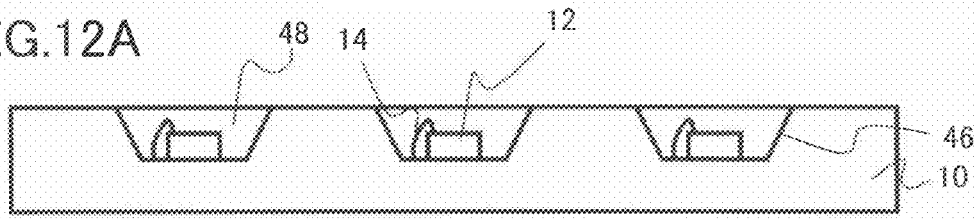
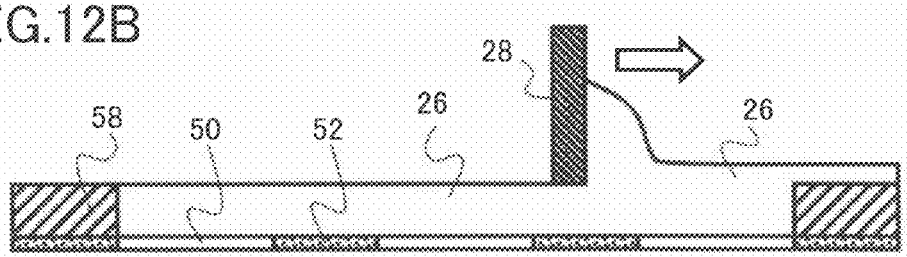
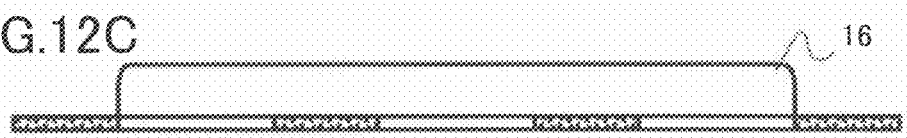
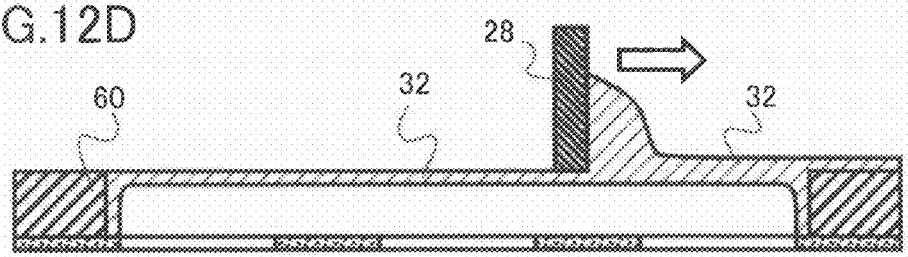
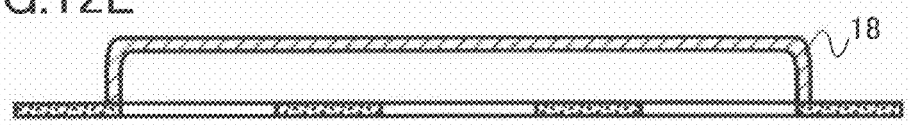
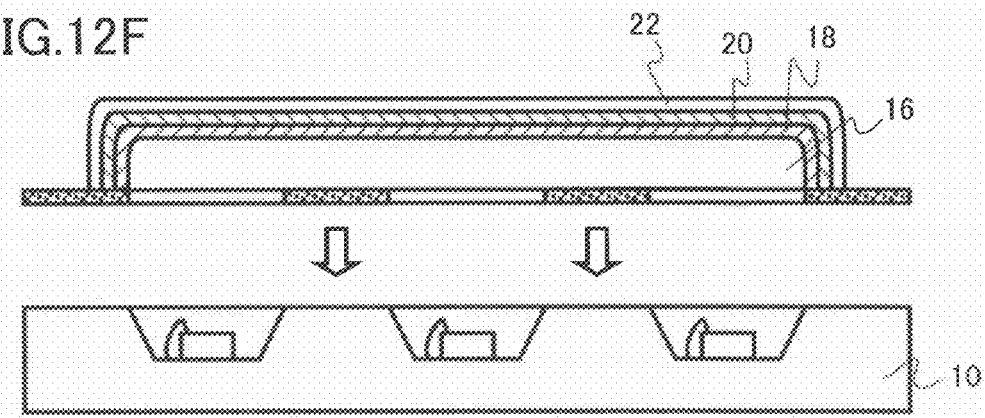

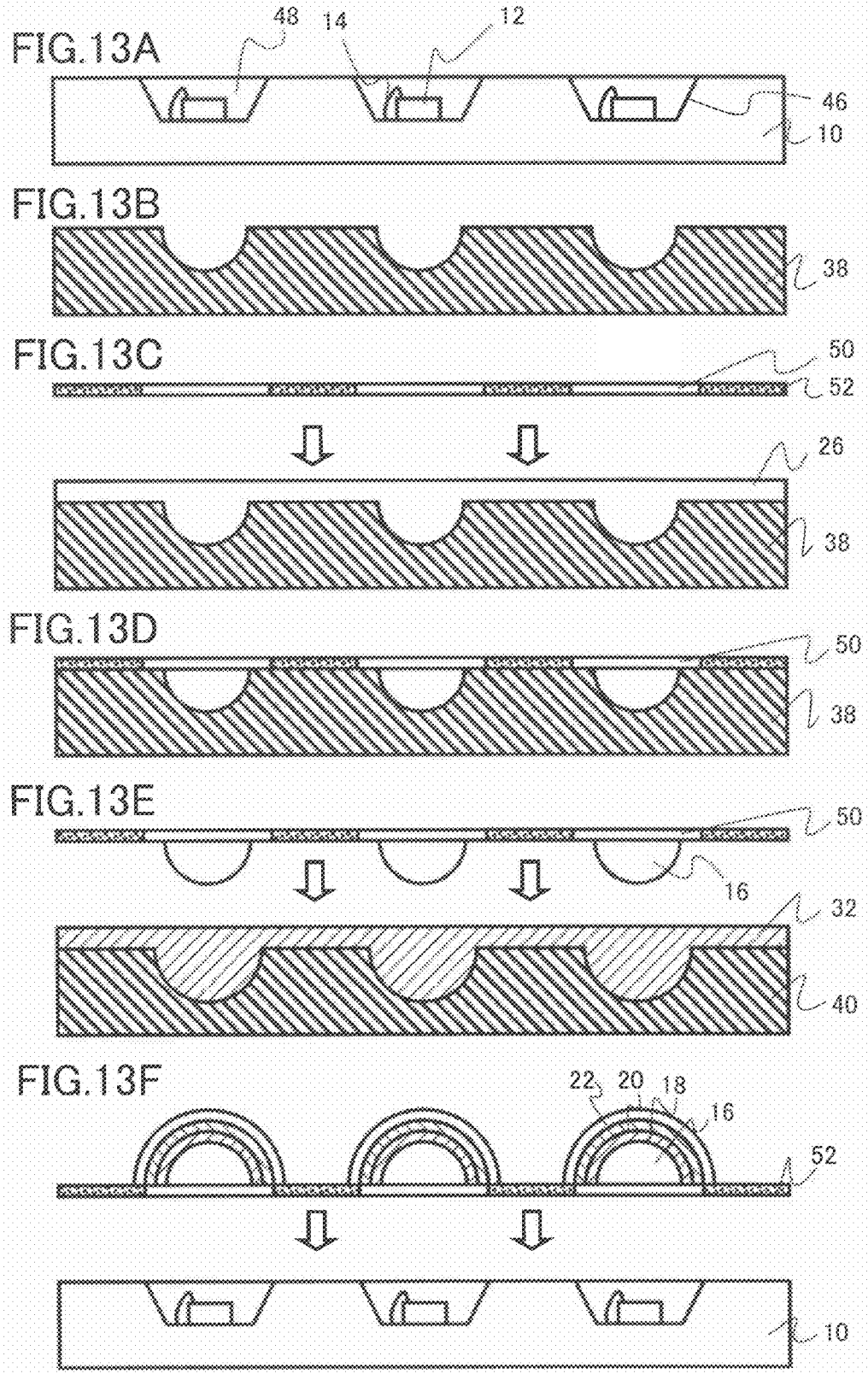

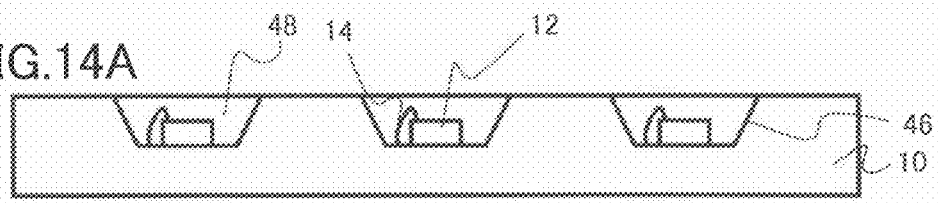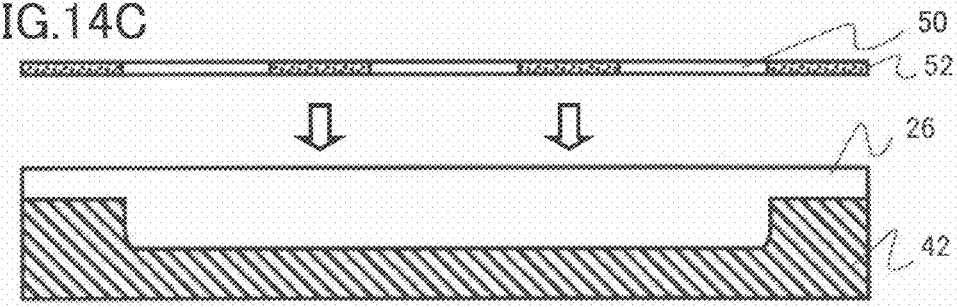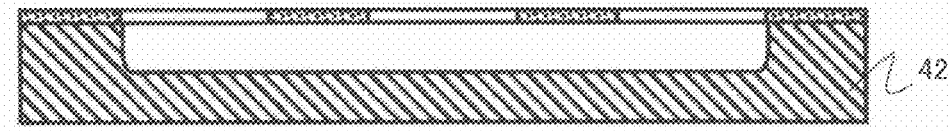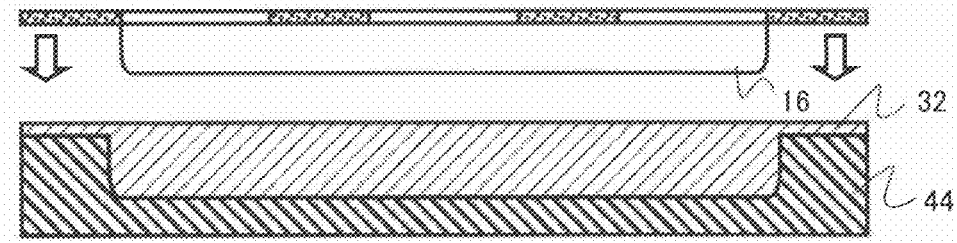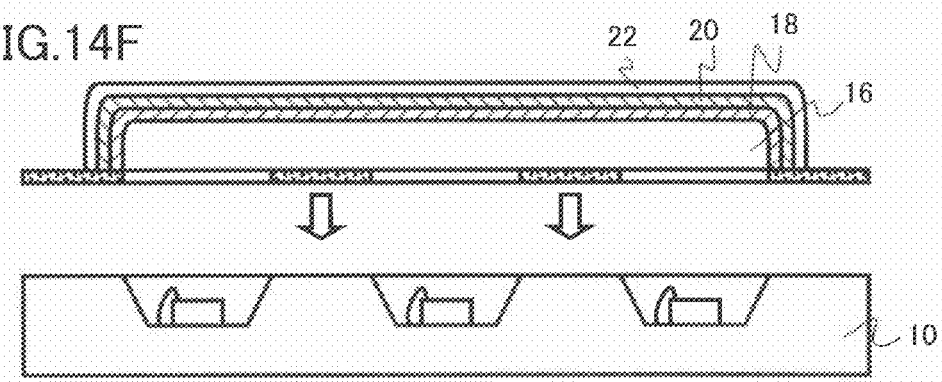

LIGHT EMITTING DEVICE AND MANUFACTURING METHOD THEREOF

CROSS-REFERENCE TO RELATED APPLICATION

This application is based upon and claims the benefit of priority from Japanese Patent Applications No. 2010-186548, filed on Aug. 23, 2010 and No. 2011-177804 filed on Aug. 16, 2011; the entire contents of which are incorporated herein by reference.

FIELD

Embodiments described herein relate generally to a light emitting device and a manufacturing method thereof.

BACKGROUND

Recently attention focuses on a so-called white-color Light Emitting Device (LED) in which a yellow phosphor such as YAG:Ce is combined with a blue LED to emit white-color light by single chip. Conventionally, the LED emits red, green, or blue light in monochromatic form, and it is necessary that the plural LEDs emitting monochrome wavelengths are driven in order to emit the white-color light or intermediate-color light. However, currently the combination of the light emitting diode and the phosphor removes the trouble to be obtain the white-color light with a simple structure.

An LED lamp in which the light emitting diode is used is applied to various display devices of a mobile device, a PC peripheral device, an OA device, various switches, a light source for backlight, and a display board. In the LED lamps, there is a strong demand for high efficiency. Additionally, there is a demand for high color rendering in general-purpose lighting applications, and there is a demand for high color gamut in backlight applications. High efficiency of the phosphor is required for the purpose of the high efficiency of the LED lamp, and a white-color light source in which a phosphor emitting blue excitation light, a phosphor excited by blue light to emit green light, and a phosphor excited by blue light to emit red light are combined is preferable to the high color rendering and the high color gamut.

The high-power LED generates heat by drive, and generally the phosphor is heated up to about 100 to about 200° C. Generally emission intensity of the phosphor is degraded when the temperature rise is generated. Therefore, desirably the degradation of the emission intensity (temperature quenching) is hardly generated even if the temperature rise is generated.

A sialon phosphor can be cited as an example of a phosphor that emits the green light when excited by blue light, and the sialon phosphor is properly used in the LED lamp. According to the sialon phosphor, the light emission is highly efficiently obtained with the small temperature quenching. Therefore, the high-efficiency, high-color-rendering, small-color-shift light emitting device is implemented by use of the sialon phosphor.

However, there is also a demand for further high efficiency in the light emitting device in which the sialon phosphor is used.

BRIEF DESCRIPTION OF THE DRAWINGS

FIG. 12A to FIG. 12F are schematic sectional views illustrating a method for manufacturing the light emitting device of the sixth embodiment.
FIG. 13A to FIG. 13F are schematic sectional views illustrating a method for manufacturing a light emitting device according to a seventh embodiment.
FIG. 14A to FIG. 14F are schematic sectional views illustrating a method for manufacturing a light emitting device according to an eighth embodiment.

DETAILED DESCRIPTION

A light emitting device according to one embodiment includes a light emitting element that emits light having a wavelength of 250 nm to 500 nm and a fluorescent layer that is disposed on the light emitting element. The fluorescent layer includes a phosphor having a composition expressed by the following equation (1) and an average particle diameter of 12 μm or more.

$$(M_{1-x1}Eu_{x1})_{3-y}Si_{13-z}Al_{3+z}O_{2+u}N_{21-w} \tag{1}$$

(In the equation (1), M is an element that is selected from IA group elements, IIA group elements, IIIA group elements, IIIB group elements except Al (Aluminum), rare-earth elements, and IVB group elements. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq1$, $-3<u-w\leq1.5$, $-2<u$, $w<21$)

A sialon phosphor having the composition expressed by the following equation (1) is a green phosphor (G). The green phosphor (G) emits light ranging from a blue-green color to a yellow-green color, that is, light having a peak at the wavelength of 490 to 580 nm, which is longer than the excitation light, when the green phosphor (G) is excited by light having the wavelength of 250 nm to 500 nm, that is, near-ultraviolet light or blue light.

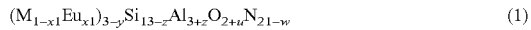

(In the equation (1), M is an element that is selected from IA group elements, IIA group elements, IIIA group elements, IIIB group elements except Al, rare-earth elements, and IVB group elements. Eu (Europium) is an emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq1$, $-3<u-w\leq1.5$, $-2<u$, $w<21$)

A sialon phosphor having the composition expressed by the following equation (2) is a red phosphor (R). The green phosphor (R) emits light ranging from an orange color to a red color, that is, light having a peak at the wavelength of 580 to 700 nm, which is longer than the excitation light, when the red phosphor (R) is excited by the light having the wavelength of 250 nm to 500 nm, that is, the near-ultraviolet light or the blue light.

$$(M'_{1-x2}Eu_{x2})_a Si_b AlO_c N_d \quad (2)$$

(In the equation (2), M' is an element that is selected from IA group elements, IIA group elements, IIIA group elements, IIIB group elements except Al, rare-earth elements, and IVB group elements. Eu is the emission center element. x2, a, b, c, and d satisfy the following relationship. $0<x2<1$, $0.55<a<0.95$, $2.0<b<3.9$, $0<c<0.6$, $4<d<5.7$)

Embodiments will be described below with reference to the drawings.

Figure 1:
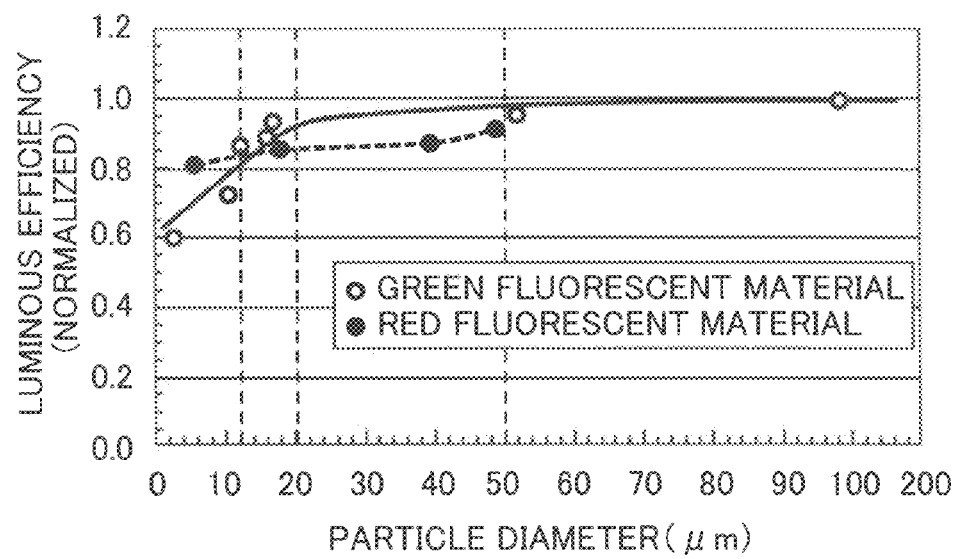
FIG. 1 is a view illustrating dependence of a particle diameter on luminous efficiency of a phosphor.

FIG. 1 is a view illustrating dependence of a particle diameter on luminous efficiency of a phosphor. The LED including the fluorescent layer containing the phosphor in which the average particle diameter of the green phosphor (G) or red phosphor (R) is changed is produced, a total luminous flux is measured with an integrating sphere, and the total luminous flux is divided by a product of an injected current and an applied voltage to evaluate luminous efficiency.

Figure 2:
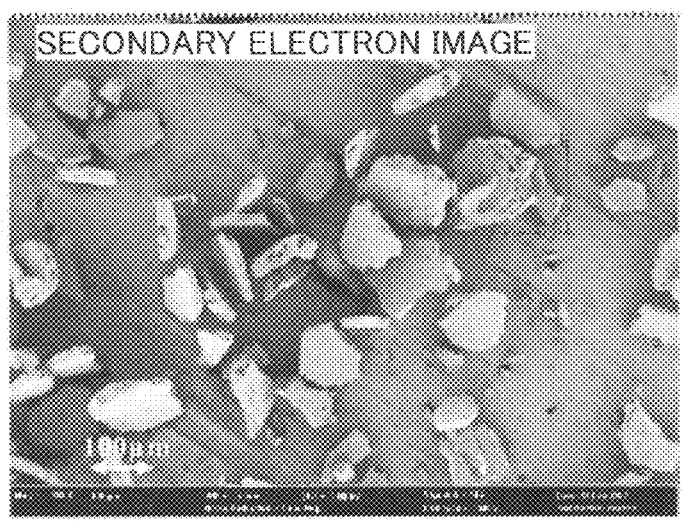
FIG. 2 illustrates a SEM photograph of an example of a green phosphor (G) used in evaluation.

FIG. 2 illustrates a SEM photograph of an example of a green phosphor (G) used in evaluation. As used herein, the average particle diameter means an average value of individually-measured maximum diameters of plural particles that are randomly extracted from fluorescent particles in a visual field of a SEM photograph. However, fine particles having particle diameters lower than 1 μm are excluded when the average value is computed.

When the phosphors are dispersed in resin or the like, the average particle diameter can be computed by observing a section of the phosphor with a SEM.

As is clear from FIG. 1, while the luminous efficiency depends dominantly on the particle diameter for the green phosphor, the clear dependence of the luminous efficiency on the particle diameter does not exist for the red phosphor. Referring to FIG. 1, from the viewpoint of obtaining the higher luminous efficiency, in the green phosphor, desirably the particle diameter is not lower than 12 μm, more desirably not lower than 20 μm, and most desirably not lower than 50 μm.

The green phosphor used in the embodiment has the composition of $(Sr_{0.92}Eu_{0.08})Si_{4.75}AlON_{7.33}$. In the green phosphor expressed by the above-described equation (1), $Sr_3Al_3Si_{13}O_2N_{21}$ is used as a base material, and Sr, Si, Al, O, or N that is of the constituent element of $Sr_3Al_3Si_{13}O_2N_{21}$ is substituted with another element or solid solution of another metallic element such as Eu is performed. Accordingly, the green phosphor used in the embodiment has the substantially same structure as the green phosphor expressed by the above-described equation (1). Therefore, it is believed that the green phosphor used in the embodiment exerts the similar dependence of the luminous efficiency on the particle diameter.

The present invention is made based on knowledge on the dependence of the specific luminous efficiency on the particle diameter, found by the inventor, in the green phosphor expressed by the above-described equation (1).

Figure 22:
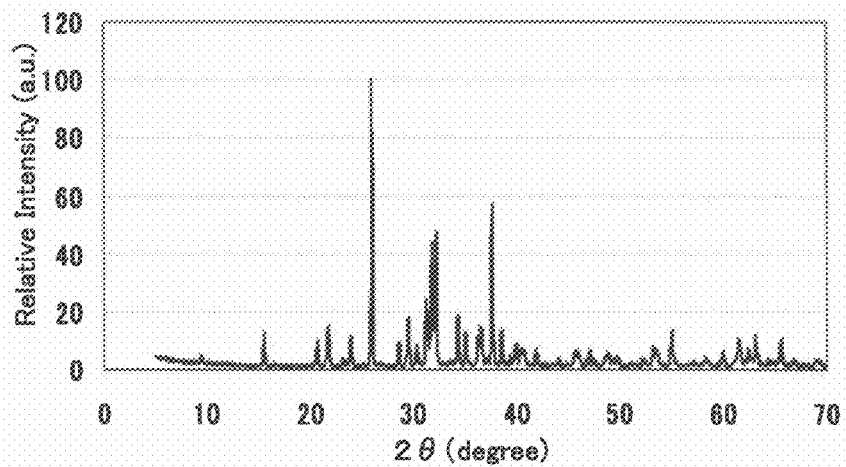
FIG. 22 is a XRD profile of the green phosphor of the example 3.
Figure 23:
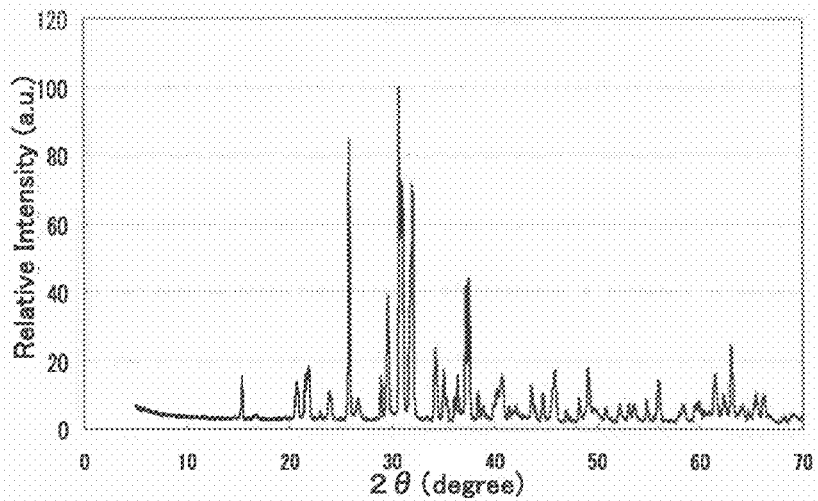
FIG. 23 is a XRD profile of the green phosphor of the example 25.

The green phosphors expressed by the above-described equation (1) of the embodiments have orthorhombic crystal structure. As shown in FIGS. 22, 23, the green phosphors include a component which shows diffraction peaks in at least 6 diffraction degree (2θ (two theta)) ranges simultaneously among 15 ranges listed below under X-ray diffraction analysis using CuKα characteristic X-ray (wave length of 1.54056 angstroms). The 15 diffraction degree (2θ (two theta)) ranges are, 30.5-30.9°, 25.6-30.0°, 31.8-32.2°, 37.2-37.6°, 37.0-37.4°, 29.3-29.7°, 34.0-34.4°, 21.7-22.1°, 48.9-49.3°, 45.7-46.1°, 62.8-63.2°, 15.2-15.6°, 61.3-61.7°, 40.5-40.9°, 55.8°-56.2°.

Figure 24:
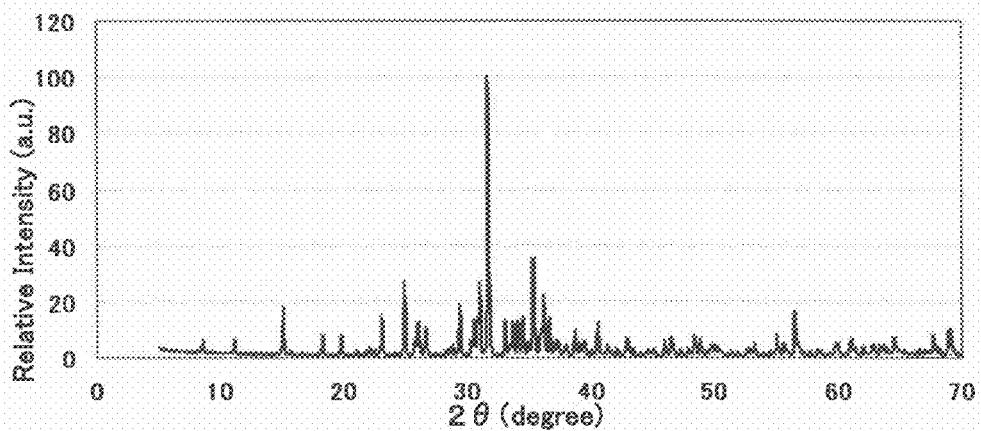
FIG. 24 is a XRD profile of the red phosphor of the example 25.
Figure 25:
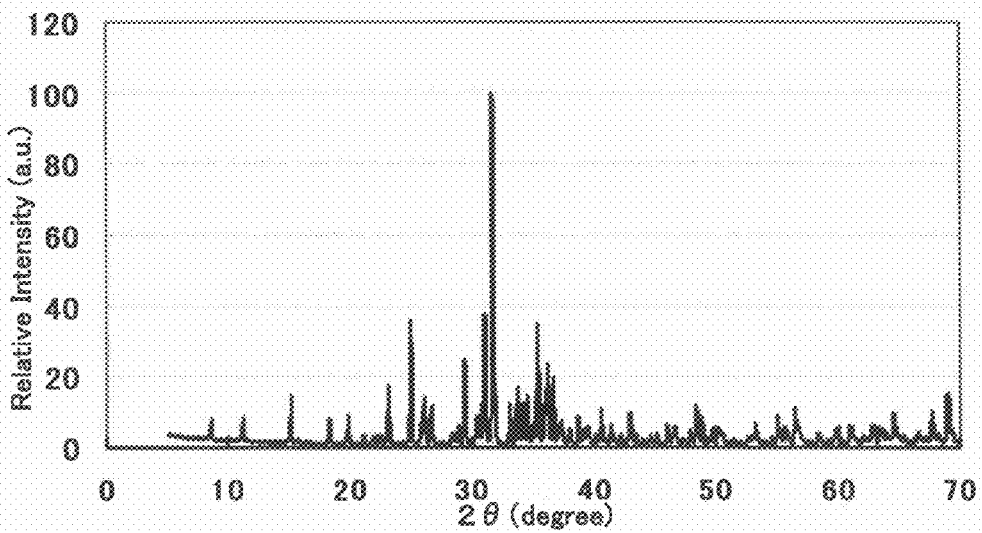
FIG. 25 is a XRD profile of the red phosphor of the example 27.

And the red phosphors expressed by the above-described equation (2) of the embodiments have orthorhombic crystal structure. As shown in FIGS. 24, 25, the red phosphors include a component which shows diffraction peaks in at least 9 diffraction degree (2θ (two theta)) ranges simultaneously among 11 ranges listed below under X-ray diffraction analysis using CuKα characteristic X-ray (wave length of 1.54056 angstroms). The 11 diffraction degree (2θ (two theta)) ranges are, 31.6-31.8°, 30.9-31.1°, 24.85-25.05°, 35.25-35.45°, 15.0-15.25°, 56.4-56.65°, 36.1-36.25°, 33.0-33.20°, 23.1-23.20°, 29.3-29.6°, 26.95-26.15°.

First Embodiment

A light emitting device according to a first embodiment includes a light emitting element that is disposed on a board and emits light having a peak wavelength of 250 nm to 500 nm and a fluorescent layer that is disposed on the light emitting element. The fluorescent layer has the composition expressed by the following equation (1), and has the average particle diameter of 12 μm or more.

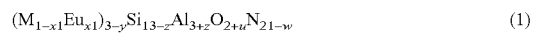

(In the equation (1), M is an element that is selected from IA group elements, IIA group elements, IIIA group elements, IIIB group elements except Al, rare-earth elements, and IVB group elements. Eu is an emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq1$, $-3<u-w\leq1.5$, $-2<u$, $w<21$)

Figure 3:
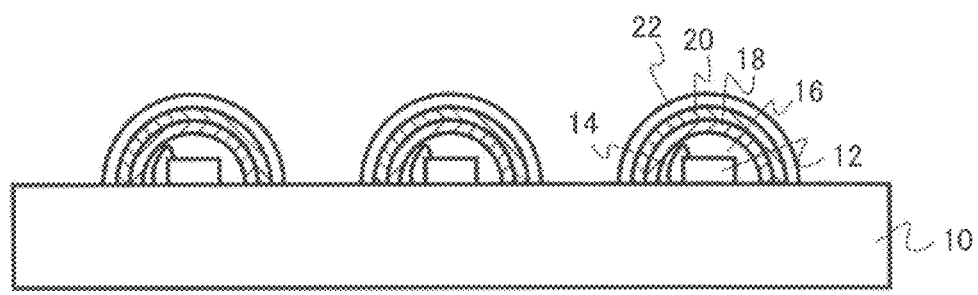
FIG. 3 is a schematic sectional view illustrating a light emitting device according to a first.

FIG. 3 is a schematic sectional view illustrating the light emitting device of the first embodiment. The light emitting device of the first embodiment includes plural blue LED chips 12 for a excitation light source mounted on a board 10. For example, each LED chip 12 is connected to wiring (not illustrated) through a gold wire 14. A driving current is supplied to the LED chip 12 from the outside through the wiring, whereby the LED chip 12 emits the blue light for excitation.

A hemispherical transparent resin layer 16 is provided on the LED chip 12. A first fluorescent layer (red fluorescent layer) 18 is disposed such that the resin layer 16 is covered therewith. The first fluorescent layer 18 in which the red phosphors are dispersed in a transparent resin absorbs the blue light emitted from the LED chip 12 and converts the blue light into the red light.

For example, the red phosphor of the first fluorescent layer 18 has the composition expressed by the following equation (2).

$$(M'_{1-x2}Eu_{x2})_a Si_b AlO_c N_d \qquad (2)$$

(In the equation (2), M' is an element that is selected from IA group elements, IIA group elements, IIIA group elements, IIIB group elements except Al, rare-earth elements, and IVB group elements. Eu is an emission center element. x2, y, z, u, and w satisfy the following relationship. $0<x2<1$, $0.55<a<0.95$, $2.0<b<3.9$, $0<c<0.6$, $4<d<5.7$)

Desirably, the element M' is Sr (Strontium). The element M' may include other elements such as Ca (Calcium) less than or equal to around 10 mol % in addition to Sr.

A second fluorescent layer (green phosphor) 20 is disposed such that the first fluorescent layer 18 is covered therewith. The second fluorescent layer 20 in which the green phosphors are dispersed in the transparent resin absorbs the blue light emitted from the LED chip 12 and converts the blue light into the green light. In other words, the first fluorescent layer (red phosphor) 18 is disposed between the LED chip 12 and the second fluorescent layer (green phosphor) 20.

The green phosphor in the second fluorescent layer has the composition expressed by the following equation (1), and the green phosphor has the average particle diameter of 12 μm or more.

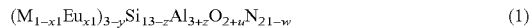

$$(M_{1-x1}Eu_{x1})_{3-y} Si_{13-z} Al_{3+z} O_{2+u} N_{21-w} \qquad (1)$$

(In the equation (1), M is an element that is selected from IA group elements, IIA group elements, IIIA group elements, IIIB group elements except Al, rare-earth elements, and IVB group elements. Eu is the emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\le1$, $-3<u-w\le1.5$, $-2<u$, $w<21$)

Desirably, the element M is Sr (Strontium). The element M may include other elements such as Ca (Calcium) less than or equal to around 10 mol % in addition to Sr.

As described above, the green phosphor in the second fluorescent layer 20 has the average particle diameter of 12 μm or more, which allows the high luminous efficiency to be obtained. From the viewpoint of obtaining the higher luminous efficiency, desirably the particle diameter is not lower than 20 μm, and more desirably not lower than 50 μm. The particle diameter may be less than 10 mm and more preferably less than 1 mm.

As to a ratio of the fluorescent particle and the resin, desirably the fluorescent particle is not lower than 10 weight percent with respect to the fluorescent layer, more desirably the fluorescent particle is not lower than 20 weight percent, and most desirably the fluorescent particle is not lower than 30 weight percent. This is because possibly the resin largely absorbs the light when the ratio of the resin in the fluorescent layer is increased.

According to the first embodiment, the high-efficiency light emitting device is implemented by the use of the green phosphor in which the composition and the average particle diameter are restricted as described above.

A hemispherical transparent resin layer 22 is provided such that the second fluorescent layer 20 is covered therewith. An outer surface of the transparent resin layer 22 is in contact with atmosphere (air). The transparent resin layer 22 has a function of suppressing total reflection of the blue light emitted from the LED chip 12, the red light from the first fluorescent layer 18, and the green light from the second fluorescent layer at the outer surface that becomes an interface with the atmosphere.

A stacked film having a four-layer structure including the transparent resin layer 16, the first fluorescent layer 18, the second fluorescent layer 20, and the transparent resin layer 22 has a hemispherical shape.

In the light emitting device of the first embodiment, when the current is passed through the LED chip 12, the light output from the transparent resin layer 22 becomes the white-color light. In the white-color light, the blue light emitted from the LED chip 12 to pass through the transparent resin layer 16, first fluorescent layer 18, second fluorescent layer 20, and transparent resin layer 22, the red light from the first fluorescent layer 18, and the green light from the second fluorescent layer 20 are mixed.

In the light emitting device of the first embodiment having the above-described configuration, the stacked structure including the transparent resin layer 16, the first fluorescent layer 18, the first fluorescent layer 20, and the transparent resin layer 22 is formed into the hemispherical shape, so that the emission color can be prevented from varying or a hue can be prevented from varying depending on a view angle. The blue light emitted from the LED chip 12 passes through the transparent resin layer 16. In the first fluorescent layer 18, the red phosphors that convert the blue light into the red light are dispersed in the transparent resin. In the first fluorescent layer 20, the green phosphors that convert the blue light into the green light are dispersed in the transparent resin. The transparent resin layer 22 has the function of suppressing the total reflection of the blue light, red light, and green light at the outer surface that becomes the interface with the atmosphere. The excitation light from the LED chip 12 can be collected to enhance the light extracting efficiency. Additionally, an air layer can be prevented from being interposed among the layers, and the degradation of the transmittance of the resin and the luminous efficiency of the phosphor can be suppressed.

A method for manufacturing the light emitting device of the first embodiment will be described below. As described above, in the green phosphor using the first embodiment, the luminous efficiency depends on the particle diameter, and the luminous efficiency is improved with increasing particle diameter. At the same time, when the particle diameter of the phosphor is increased, a technique of falling in drops of the resin in which the phosphors are dispersed on the light emitting element with a dispenser (constant liquid delivery apparatus) is hardly adopted in forming the fluorescent layer. Because a diameter of a syringe of the dispenser is restricted, clogging is possibly generated when the particle diameter is increased.

In the method for manufacturing the light emitting device of the first embodiment, the light emitting element that emits the light having the wavelength of 250 nm to 500 nm is mounted on the surface of the board, a mask having an opening in a region where the light emitting element is mounted is placed on the board, the resin including the phosphor having the composition expressed by the following equation (1) and the average particle diameter of 12 μm or more is applied onto the mask, the resin except the resin with which the opening is filled is removed from the mask surface with squeeze, the mask is removed from the board, and a heat treatment is performed to cure the resin.

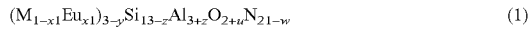
$$(M_{1-x1}Eu_{x1})_{3-y}Si_{13-z}Al_{3+z}O_{2+u}N_{21-w} \quad (1)$$

(In the equation (1), M is an element that is selected from IA group elements, IIA group elements, IIIA group elements, IIIB group elements except Al, rare-earth elements, and IVB group elements. Eu is the emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq1$, $-3<u-w\leq1.5$, $-2<u$, $w<21$)

The light emitting device is produced with no use of the dispenser, because the method for manufacturing the light emitting device of the first embodiment has the above-described configuration. Therefore, the high-efficiency light emitting device can be produced by the stable manufacturing method.

FIG. 4A to FIG. 4D are schematic sectional views illustrating a method for manufacturing the light emitting device of the first embodiment. The blue LED chips 12 for excitation light sources are mounted on the surface of the board 10. Then, a metallic mask 24 having the opening in the region where the blue LED 12 is mounted is placed on the board 10, and a transparent resin 26 is applied onto the mask 24 in a wide range of the mask 24 with no use of the dispenser. For example, the transparent resin 26 is a silicone resin.

Figure 4A:
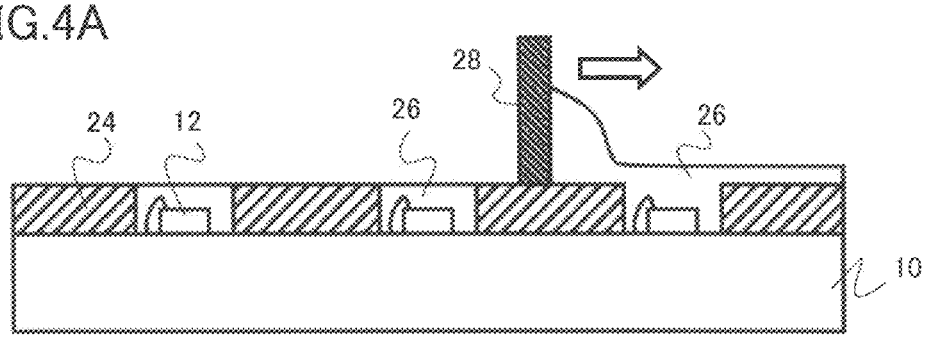
FIG. 4A to FIG. 4D are schematic sectional views illustrating a method for manufacturing the light emitting device of the first embodiment.

The transparent resin 26 except the transparent resin 26 with which the opening is filled is removed from the surface of the mask 24 with a squeeze 28 (FIG. 4A).

Figure 4B:

The mask 24 is removed from the board 10, and the board 10 is subjected to the heat treatment to cure the transparent resin 26, thereby forming the transparent resin layer 16 (FIG. 4B).

Then, the metallic mask 30 having an opening corresponding to the region where the blue LED 12 is mounted is placed on the board 10. The opening of the mask 30 is designed wider than that of the mask 24. A binder resin 32 in which the red phosphors are dispersed is applied onto the mask 30 in the wide range of the mask 30 with no use of the dispenser. For example, the binder resin 32 is a silicone resin.

Figure 4C:
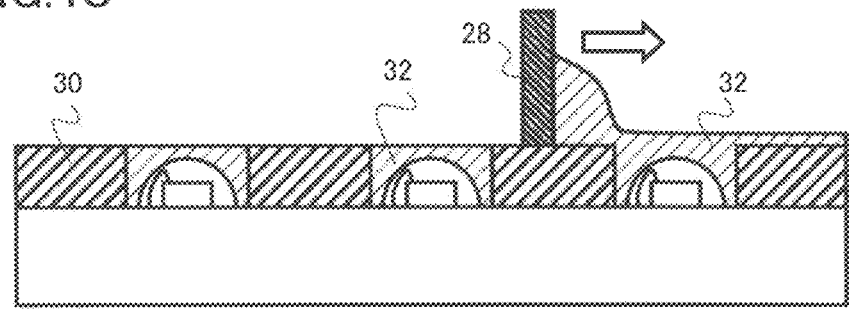

The binder resin 32 except the binder resin 32 with which the opening is filled is removed from the surface of the mask 30 with the squeeze 28 (FIG. 4C).

Figure 4D:
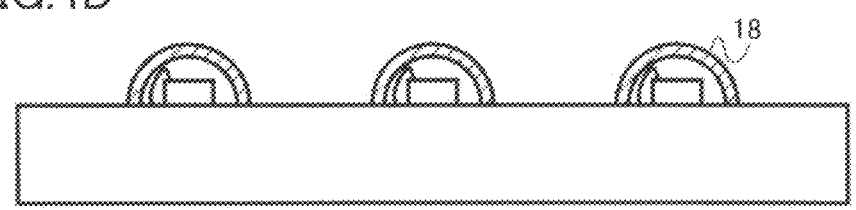

The mask 30 is removed from the board 10, and the board 10 is subjected to the heat treatment to cure the binder resin 32, thereby forming the first fluorescent layer 18 (FIG. 4D).

Then, the second fluorescent layer 20 and the transparent resin layer 22 are formed by repeating the similar process to produce the light emitting device illustrated in FIG. 3.

For example, the green phosphor that is included in the second fluorescent layer and expressed by the equation (1) can be synthesized using a nitride of the element M or a carbide of cyanamide of the nitride of the element M, a nitride, an oxide, or a carbide of an element of Al or Si, and an oxide, a nitride or a carbonate of an emission center element R as a starting material.

More specifically, when the phosphor that contains Sr as the element M and Eu as the emission center element is made, $Sr_3N_2$, AlN, $Si_3N_4$, $Al_2O_3$, and EuN can be used as the starting material. $Ca_3N_2$, $Ba_3N_2$ and a mixture thereof may be used instead of $Sr_3N_2$, and $Ca_3N_2$, $Ba_3N_2$, $Sr_2N$, SrN, and a mixture thereof may be used instead of the $Sr_3N_2$.

The starting material are weighed and mixed so as to obtain the desired composition, and the target phosphor can be obtained by burning the obtained mixture powders. For example, a technique of performing mortar mixing in a glove box can be cited as an example of the mixing. A boron nitride, a silicon nitride, a silicon carbide, carbon, an aluminum nitride, sialon, an aluminum oxide, molybdenum, or tungsten can be used as a material for a crucible.

Second Embodiment

A light emitting device according to a second embodiment differs from the light emitting device of the first embodiment only in that the stacked film including the transparent resin layer, the first fluorescent layer, the second fluorescent layer, and the transparent resin layer is not separately formed on the individual LED chip, but formed into a sheet shape with which the plural LED chips are collectively covered. Therefore, the description overlapping with that of the first embodiment is omitted.

Figure 5:
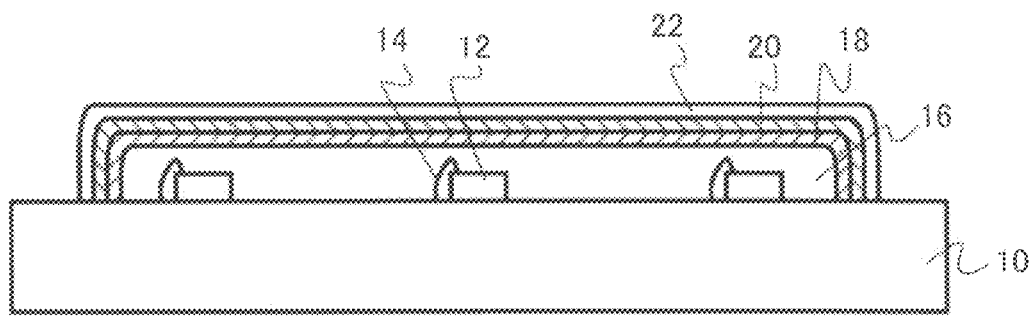
FIG. 5 is a schematic sectional view illustrating a light emitting device according to a second embodiment.

FIG. 5 is a schematic sectional view illustrating the light emitting device of the second embodiment. The stacked film including the transparent resin layer 16, the first fluorescent layer 18, the second fluorescent layer 20, and the transparent resin layer 22 is formed into the flat sheet shape with which the LED chips 12 are collectively covered.

FIG. 6A to FIG. 6D are schematic sectional views illustrating a method for manufacturing the light emitting device of the second embodiment. The blue LED chips 12 for excitation light sources are mounted on the surface of the board 10. The region where the blue LED 12 is mounted is collectively opened, for example, a metallic mask 34 is placed on the board 10, and the transparent resin 26 is applied onto the mask 34 in a wide range of the mask 34 with no use of the dispenser. For example, the transparent resin 26 is a silicone resin.

Figure 6A:
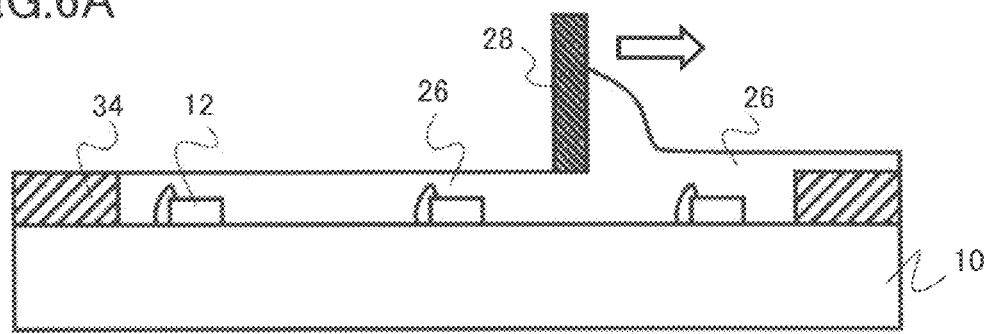
FIG. 6A to FIG. 6D are schematic sectional views illustrating a method for manufacturing the light emitting device of the second embodiment.

Then, the transparent resin 26 except the transparent resin 26 with which the opening is filled is removed from the surface of the mask 34 with the squeeze 28 (FIG. 6A).

Figure 6B:
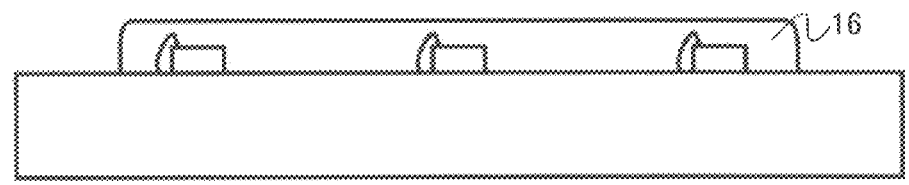

Then, the mask 34 is removed from the board 10, and the board 10 is subjected to the heat treatment to cure the transparent resin 26, thereby forming the transparent resin layer 16 (FIG. 6B).

Then, the metallic mask 36 having an opening corresponding to the region where the blue LED 12 is mounted is placed on the board 10. The opening of the mask 36 is designed wider than that of the mask 34. The binder resin 32 in which the red phosphors are dispersed is applied onto the mask 36 in the wide range of the mask 36 with no use of the dispenser. For example, the binder resin 32 is a silicone resin.

Figure 6C:
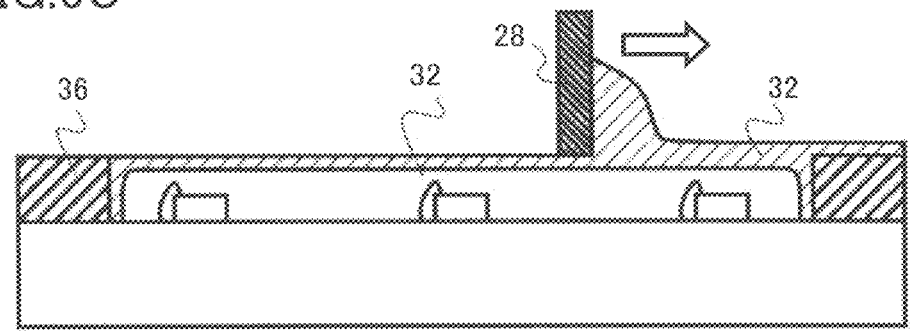

Then, the binder resin 32 except the binder resin 32 with which the opening is filled is removed from the surface of the mask 36 with the squeeze 28 (FIG. 6C).

Figure 6D:
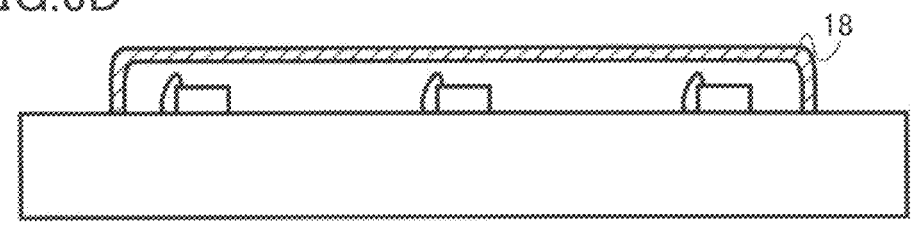

Then, the mask 36 is removed from the board 10, and the board 10 is subjected to the heat treatment to cure the binder resin 32, thereby forming the first fluorescent layer 18 (FIG. 6D).

Then, the second fluorescent layer 20 and the transparent resin layer 22 are formed by repeating the similar process to produce the light emitting device illustrated in FIG. 5.

According to the second embodiment, alignment of the mask with the board can be relaxed. Accordingly, productivity and a yield of the light emitting device are advantageously improved.

Third Embodiment

A method for manufacturing a light emitting device according to a third embodiment is another method for manufacturing the light emitting device of the first embodiment illustrated in FIG. 3.

In the method for manufacturing the light emitting device of the third embodiment, the light emitting element that emits the light having the wavelength of 250 nm to 500 nm is mounted on the surface of the board, a resin including the phosphor having the composition expressed by the following equation (1) and the average particle diameter of 12 μm or more is applied onto the die having a recess whose diameter larger than that of the light emitting element, the board and the die are pressed against each other while overlapping each other such that the light emitting element is fitted in the recess, the resin except the recess is removed from the surfaces of the board and die, the board and the die are separated from each other such that the resin of the recess is left on the light emitting element, and the board is subjected to the heat treatment to cure the resin.

$$(M_{1-x1}Eu_{x1})_{3-y}Si_{13-z}Al_{3+z}O_{2+u}N_{21-w} \quad (1)$$

(In the equation (1), M is an element that is selected from IA group elements, IIA group elements, IIIA group elements, IIIB group elements except Al, rare-earth elements, and IVB group elements. Eu is the emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq 1$, $-3<u-w\leq 1.5$, $-2<u$, $w<21$)

Figure 7A:
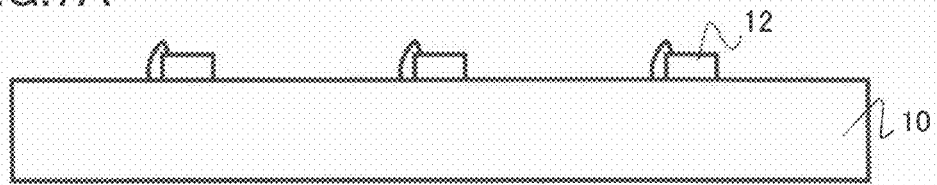
FIG. 7A to FIG. 7E are schematic sectional views illustrating a method for manufacturing a light emitting device according to a third embodiment.
Figure 7B:

FIG. 7A to FIG. 7E are schematic sectional views illustrating a method for manufacturing the light emitting device of the third embodiment. The blue LED chips 12 for excitation light sources are mounted on the surface of the board 10 (FIG. 7A). A die 38 having a recess whose diameter is larger than that of the blue LED chip 12 is prepared (FIG. 7B).

Figure 7C:
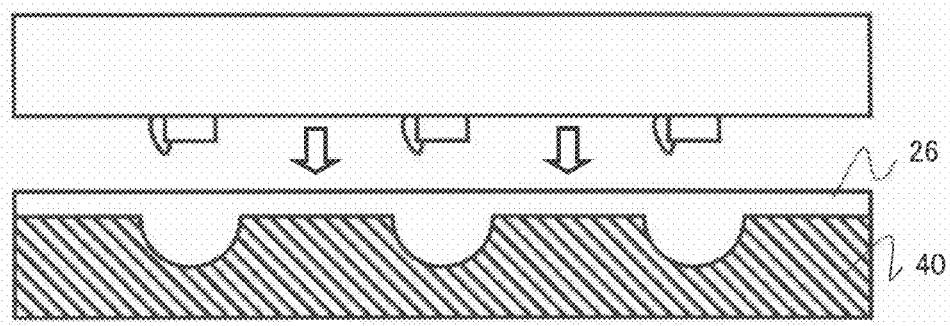

Then, the transparent resin 26 is applied onto the die 38 in a wide range of the die 38 with no use of the dispenser (FIG. 7C). For example, the transparent resin 26 is a silicone resin.

Figure 7D:
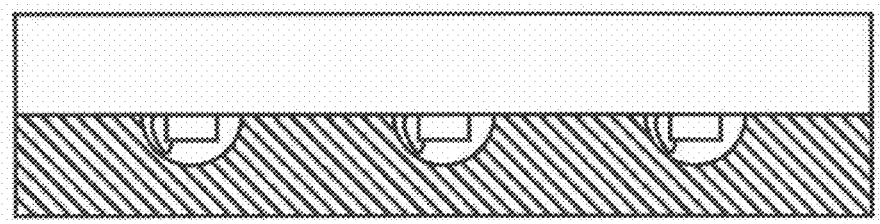

The board 10 and the die 38 are pressed against each other while overlapping each other such that the LED chip 12 is fitted in the recess, and the transparent resin 26 except the recess is removed from the surfaces of the board 10 and die 38 (FIG. 7D).

Then, the board 10 and the die 38 are separated from each other such that the transparent resin 26 is left on the LED chip 12, and the board 10 is subjected to the heat treatment to cure the transparent resin, thereby forming the transparent resin layer 16.

Figure 7E:
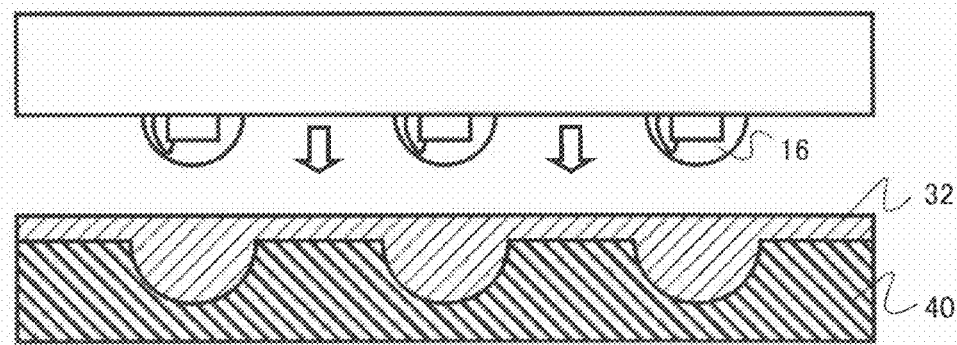

Then, a die 40 having a recess whose diameter is larger than that of the blue LED chip 12 is prepared. The die 40 is designed such that the diameter and a depth of the die 40 are larger than those of the die 38. The binder resin 32 in which the red phosphors are dispersed is applied onto the die 40 in the wide range of the die 40 with no use of the dispenser (FIG. 7E). For example, the binder resin 32 is a silicone resin.

Then, the board 10 and the die 40 are pressed against each other while overlapping each other such that the LED chip 12 is fitted in the recess, and the binder resin 32 except the recess is removed from the surfaces of the board 10 and die 40.

Then, the board 10 and the die 40 are separated from each other such that the binder resin 32 is left on the LED chip 12, and the board is subjected to the heat treatment to cure the transparent resin, thereby forming the first fluorescent layer 18 illustrated in FIG. 3.

Then, the second fluorescent layer 20 and the transparent resin layer 22 are formed by repeating the similar process to produce the light emitting device illustrated in FIG. 3.

The light emitting device is also produced with no use of the dispense, because the method for manufacturing the light emitting device of the third embodiment has the above-described configuration. Therefore, the high-efficiency light emitting device can be produced by the stable manufacturing method.

Fourth Embodiment

A method for manufacturing a light emitting device according to a fourth embodiment is another method for manufacturing the light emitting device of the second embodiment illustrated in FIG. 5.

Figure 8A:
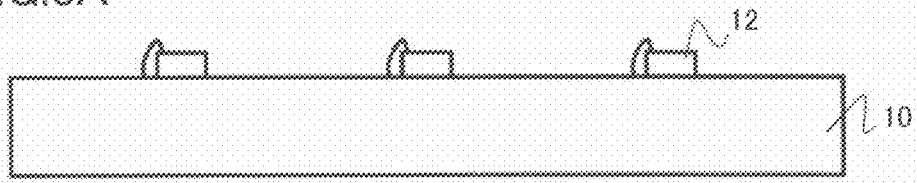
FIG. 8A to FIG. 8E are schematic sectional views illustrating a method for manufacturing a light emitting device according to a fourth embodiment.
Figure 8B:

FIG. 8A to FIG. 8E are schematic sectional views illustrating a method for manufacturing the light emitting device of the fourth embodiment. The blue LED chips 12 for excitation light sources are mounted on the surface of the board 10 (FIG. 8A). A die 42 having a recess is prepared, the diameter of the recess is larger than that of the blue LED chip 12, and the plural blue LED chips 12 are collectively included in the recess (FIG. 8B).

Figure 8C:
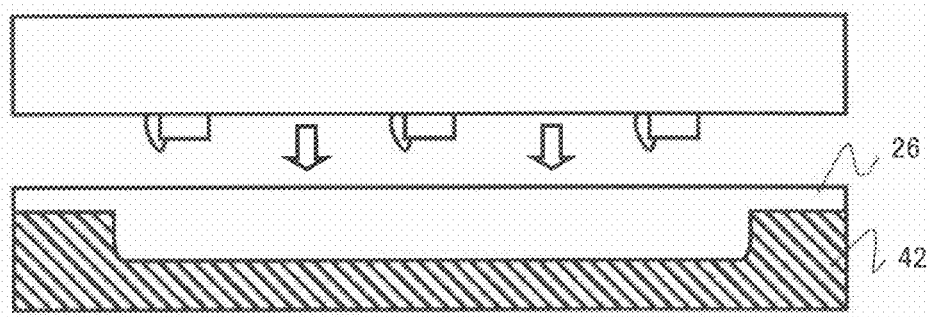

Then, the transparent resin 26 is applied onto the die 42 in a wide range of the die 42 with no use of the dispenser (FIG. 8C). For example, the transparent resin 26 is a silicone resin.

Figure 8D:
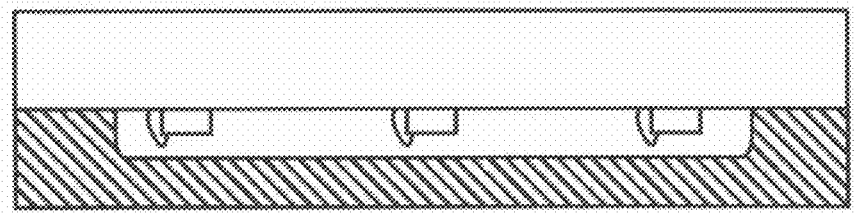

The board 10 and the die 42 are pressed against each other while overlapping each other such that the plural LED chips 12 are fitted in the recess, and the transparent resin 26 except the recess is removed from the surfaces of the board 10 and die 42 (FIG. 8D).

Then, the board 10 and the die 42 are separated from each other such that the transparent resin 26 is left on the LED chips 12, and the board 10 is subjected to the heat treatment to cure the transparent resin 26, thereby forming the transparent resin layer 16.

Figure 8E:
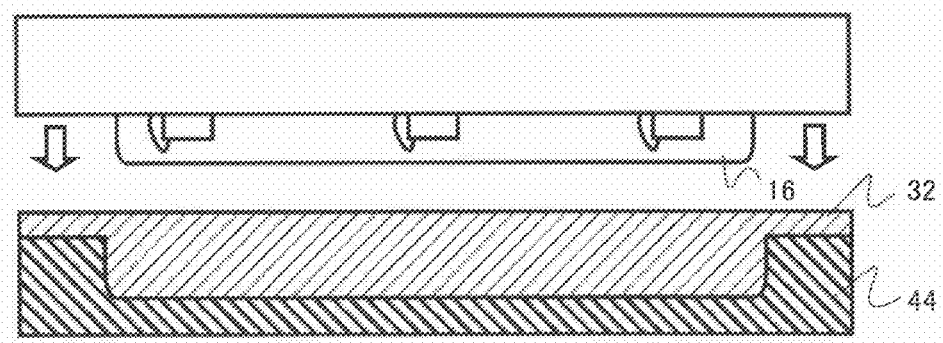

Then, a die 44 having a recess whose diameter is larger than that of the blue LED chip 12 is prepared. The die 44 is designed such that the diameter and depth of the die 44 are larger than those of the die 42. The binder resin 32 in which the red phosphors are dispersed is applied onto the die 44 in the wide range of the die 44 with no use of the dispenser (FIG. 8E). For example, the binder resin 32 is a silicone resin.

Then, the board 10 and the die 44 are pressed against each other while overlapping each other such that the LED chips 12 are fitted in the recess, and the binder resin 32 except the recess is removed from the surfaces of the board 10 and die 44.

Then, the board 10 and the die 44 are separated from each other such that the binder resin 32 is left on the LED chips 12, and the board is subjected to the heat treatment to cure the transparent resin 26, thereby forming the first fluorescent layer 18 illustrated in FIG. 5.

Then, the second fluorescent layer 20 and the transparent resin layer 22 are formed by repeating the similar process to produce the light emitting device illustrated in FIG. 5.

Fifth Embodiment

A light emitting device according to a fifth embodiment differs from the light emitting device of the first embodiment in that the hemispherical four-layer-structure stacked film including the transparent resin layer 16, the first fluorescent layer 18, the second fluorescent layer 20, and the transparent resin layer 22 is formed on a deformable resin sheet shape. The description overlapped with that of the first embodiment is omitted.

Figure 9:
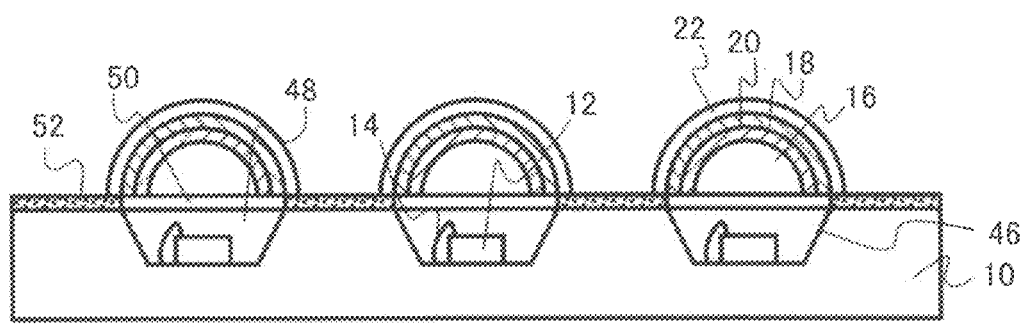
FIG. 9 is a schematic sectional view illustrating a light emitting device according to a fifth embodiment.

FIG. 9 is a schematic sectional view illustrating the light emitting device of the fifth embodiment. The light emitting device of the fifth embodiment includes plural blue LED chips 12 for excitation light mounted on a board 10. Plural recesses 46 are provided in the surface of the board 10. Each LED chip 12 is disposed in the recess 46. For example, each LED chip 12 in the recess 46 is connected to the wiring (not illustrated) through the gold wire 14. The driving current is supplied to the LED chip 12 from the outside through the wiring, whereby the LED chip 12 emits the blue light for excitation.

The LED chip 12 is sealed in the recess 46 by a transparent resin layer 48. A deformable transparent resin sheet 50 is provided such that the transparent resin layer 48 immediately above the LED chip 12 is covered therewith.

A reflection layer 52 is provided in a region except the region immediately above the recess 46 of the resin sheet 50. In the reflection layer 52, materials such as Ag fine particles and titanium oxide fine particles which reflect the light from a near-ultraviolet range to a visible range are dispersed in the resin.

The hemispherical transparent resin layer 16 is provided on the LED chip 12 of the resin sheet 50. The first fluorescent layer 18 is disposed such that the resin layer 16 is covered therewith. In the first fluorescent layer 18, the red phosphors that absorb the blue light emitted from the LED chip 12 and convert the blue light into the red light are dispersed in the transparent resin.

For example, the red phosphor of the first fluorescent layer 18 has the composition expressed by the following equation (2).

$$(M'_{1-x2}Eu_{x2})_a Si_b AlO_c N_d \qquad (2)$$

(In the equation (2), M' is an element that is selected from IA group elements, IIA group elements, IIIA group elements, IIIB group elements except Al, rare-earth elements, and IVB group elements. Eu is the emission center element. x2, a, b, c, and d satisfy the following relationship. $0 < x2 < 1$, $0.55 < a < 0.95$, $2.0 < b < 3.9$, $0 < c < 0.6$, $4 < d < 5.7$)

Desirably, the element M' is Sr.

The second fluorescent layer 20 is disposed such that the first fluorescent layer 18 is covered therewith. In the second fluorescent layer 20, the green phosphors that absorb the blue light emitted from the LED chip 12 and convert the blue light into the green light are dispersed in the transparent resin.

The green phosphor in the second fluorescent layer has the composition expressed by the following equation (1), and has the average particle diameter of 12 μM or more.

$$(M_{1-x1}Eu_{x1})_{3-y}Si_{13-z}Al_{3+z}O_{2+u}N_{21-w} \qquad (1)$$

(In the equation (1), M is an element that is selected from IA group elements, IIA group elements, IIIA group elements, IIIB group elements except Al, rare-earth elements, and IVA group elements. Eu is the emission center element. x1, y, z, u, and w satisfy the following inequalities simultaneously, that is to say each of the following inequalities is satisfied by the choice of values of the identified paramaters within the noted ranges. $0 < x1 < 1$, $-0.1 < y < 0.3$, $-3 < z \leq 1$, $-3 < u-w \leq 1.5$, $-2 < u$, $w < 21$)

Desirably, the element M is Sr.

As described above, the green phosphor in the second fluorescent layer 20 has the average particle diameter of 12 μm or more, which allows the high luminous efficiency to be obtained. From the viewpoint of obtaining the higher luminous efficiency, desirably the particle diameter is not lower than 20 μm, and more desirably not lower than 50 μm.

According to the fifth embodiment, the high-efficiency light emitting device is implemented by the use of the green phosphor in which the composition and the average particle diameter are restricted as described above.

The hemispherical transparent resin layer 22 is provided such that the second fluorescent layer 20 is covered therewith. The outer surface of the transparent resin layer 22 is in contact with atmosphere (air). The transparent resin layer 22 has a function of suppressing total reflection of the blue light emitted from the LED chip 12, the red light from the first fluorescent layer 18, and the green light from the second fluorescent layer 20 at the outer surface that becomes an interface with the atmosphere.

The four-layer structure including the transparent resin layer 16, the first fluorescent layer 18, the second fluorescent layer 20, and the transparent resin layer 22 has the hemispherical shape.

In the light emitting device of the fifth embodiment, when the current is passed through the LED chip 12, the light output from the transparent resin layer 22 becomes the white-color light. In the white-color light, the blue light emitted from the LED chip 12 to pass through the transparent resin layer 16, first fluorescent layer 18, second fluorescent layer 20, and transparent resin layer 22, the red light from the first fluorescent layer 18, and the green light from the second fluorescent layer 20 are mixed.

In the light emitting device of the fifth embodiment having the above-described configuration, the hemispherical stacked structure including the transparent resin layer 16, the first fluorescent layer 18, the first fluorescent layer 20, and the transparent resin layer 22 is formed on the resin sheet 50, so that the emission color can be prevented from varying or the hue can be prevented from varying depending on the view angle. The blue light emitted from the LED chip 12 passes through the transparent resin layer 16. In the first fluorescent layer 18, the red phosphors that convert the blue light into the red light are dispersed in the transparent resin. In the second fluorescent layer 20, the green phosphors that convert the blue light into the green light are dispersed in the transparent resin. The transparent resin layer 22 has the function of suppressing the total reflection of the blue light, red light, and green light at the outer surface that becomes the interface with the atmosphere. The excitation light from the LED chip 12 can be collected to enhance the light extracting efficiency. Additionally, the air layer can be prevented from being interposed among the layers, and the degradation of the transmittance of the resin and the luminous efficiency of the phosphor can be suppressed.

In the light emitting device of the fifth embodiment, the reflection layer 52 in which the materials reflecting the light ranging from the near-ultraviolet light to the visible light are dispersed is provided in the region except the region where the hemispherical stacked structure including the transparent resin layer 16, the first fluorescent layer 18, the second fluorescent layer 20, and the transparent resin layer 22, and the transparent resin layer 22 has the function of suppressing the total reflection of the blue light, red light, and green light at the outer surface that becomes the interface with the atmosphere. Therefore, the light emitting device of the fifth embodiment can emit the high-luminance light at high luminous efficiency. Thermal radiation performance can further be improved when thermal radiation fillers are dispersed in the reflection layer 52.

A method for manufacturing the light emitting device of the fifth embodiment will be described below. As described above, in the green phosphor using the fifth embodiment, the luminous efficiency depends on the particle diameter, and the luminous efficiency is improved with increasing particle diameter. At the same time, when the particle diameter of the phosphor is increased, a technique of falling in drops of the resin in which the phosphors are dispersed on the light emitting element with a dispenser (constant liquid delivery apparatus) is hardly adopted in forming the fluorescent layer. Because a diameter of a syringe of the dispenser is restricted, clogging is possibly generated when the particle diameter is increased.

In the method for manufacturing the light emitting device of the fifth embodiment, the light emitting element that emits the light having the wavelength of 250 nm to 500 nm is mounted on the surface of the board, the deformable resin sheet having the region through which the light emitted from the light emitting element is transmitted is prepared, the mask having the opening in the region where the light emitting element is mounted is placed on the board, the resin including the phosphor having the composition expressed by the following equation (1) and the average particle diameter of 12 μm or more is applied onto the mask, the resin except the resin with which the opening is filled is removed from the mask surface with squeeze, the mask is removed from the resin sheet, the heat treatment is performed to cure the resin, and the resin sheet is bonded such that the region is located above the light emitting element.

$$(M_{1-x1}Eu_{x1})_{3-y}Si_{13-z}Al_{3+z}O_{2+u}N_{21-w} \quad (1)$$

(In the equation (1), M is an element that is selected from IA group elements, IIA group elements, IIIA group elements, IIIB group elements except Al, rare-earth elements, and IVB group elements. Eu is the emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\leq1$, $-3<u-w\leq1.5$, $-2<u$, $w<21$)

The light emitting device is produced with no use of the dispenser, because the method for manufacturing the light emitting device of the fifth embodiment has the above-described configuration. Therefore, the high-efficiency light emitting device can be produced by the stable manufacturing method.

Figure 10A:
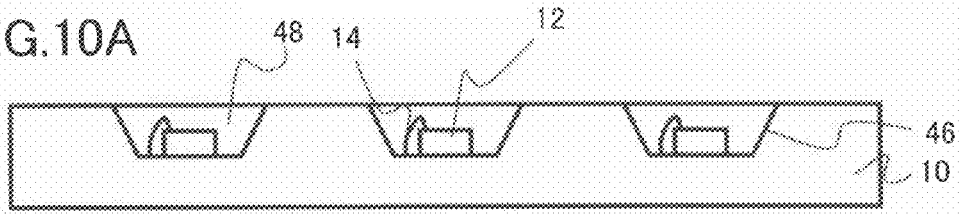
FIG. 10A to FIG. 10F are schematic sectional views illustrating a method for manufacturing the light emitting device of the fifth embodiment.

FIG. 10A to FIG. 10F are schematic sectional views illustrating a method for manufacturing the light emitting device of the fifth embodiment. The blue LED chips 12 for excitation light sources are mounted on the recesses 46 of the board 10 by sealing the LED chips 12 using the transparent resin layer 48 (FIG. 10A).

Then, the deformable resin sheet 50 having the region through which the light emitted from the LED chip 12 is transmitted is prepared. As used herein, the region through which the light is transmitted means a region except the reflection layer 52 of the resin sheet 50.

Then, a metallic mask 54 having the opening in the region where the blue LED 12 is mounted is placed on the resin sheet 50, and a transparent resin 26 is applied onto the mask 54 in the wide range of the mask 54 with no use of the dispenser. For example, the transparent resin 26 is a silicone resin.

Figure 10B:
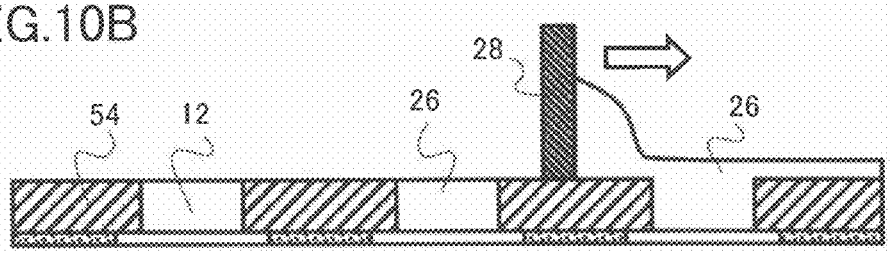

The transparent resin 26 except the transparent resin 26 with which the opening is filled is removed from the surface of the mask 54 with the squeeze 28 (FIG. 10B).

Figure 10C:

Then, the mask 54 is removed from the resin sheet 50, and the resin sheet 50 is subjected to the heat treatment to cure the transparent resin 26, thereby forming the transparent resin layer 16 (FIG. 10C).

Then, a metallic mask 56 having the opening in the region where the blue LED 12 is mounted is placed on the resin sheet 50. The opening of the mask 56 is designed wider than that of the mask 54. The binder resin 32 in which the red phosphors are dispersed is applied onto the mask 56 in the wide range of the mask 56 with no use of the dispenser. For example, the binder resin 32 is a silicone resin.

Figure 10D:
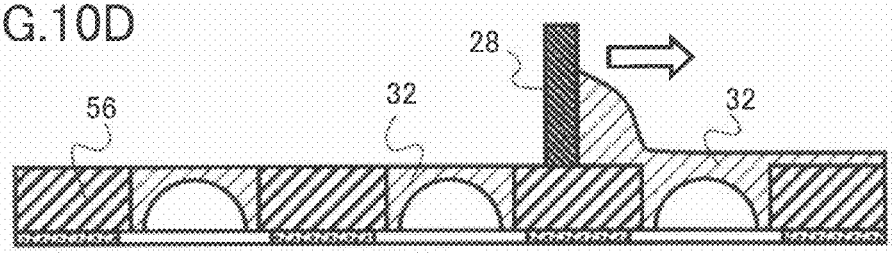

Then, the binder resin 32 except the binder resin 32 with which the opening is filled is removed from the surface of the binder resin 50 with the squeeze 28 (FIG. 10D).

Figure 10E:
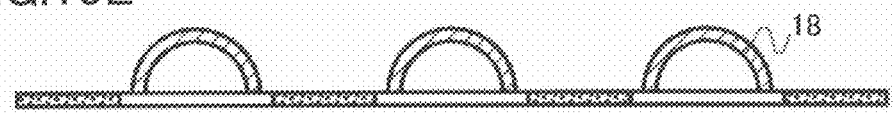

Then, the mask 56 is removed from the resin sheet 50, and the resin sheet 50 is subjected to the heat treatment to cure the binder resin 32, thereby forming the first fluorescent layer 18 (FIG. 10E).

Figure 10F:
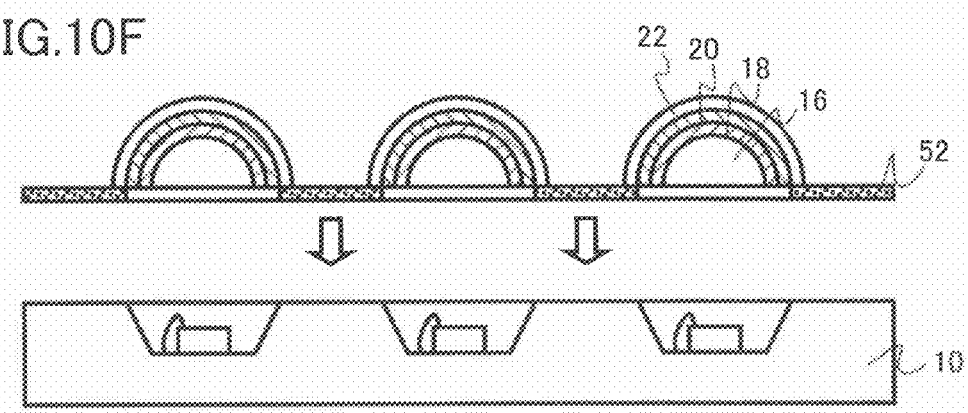

Then, the second fluorescent layer 20 and the transparent resin layer 22 are formed on the resin sheet 50 by repeating the similar process. Then, the board 10 and the resin sheet 50 are bonded such that the region through which the light is transmitted is located on the LED chip 12 (FIG. 10F). Thus, the light emitting device illustrated in FIG. 9 is produced.

For example, the green phosphor that is included in the second fluorescent layer and expressed by the equation (1) can be synthesized using a nitride of the element M or a carbide of cyanamide of the nitride of the element M, a nitride, an oxide, or a carbide of an element of Al or Si, and an oxide, a nitride or a carbonate of an emission center element R as the starting material.

More specifically, when the phosphor that contains Sr as the element M and Eu as the emission center element is made, $Sr_3N_2$, AlN, $Si_3N_4$, $Al_2O_3$, and EuN can be used as the starting material. $Ca_3N_2$, $Ba_3N_2$ and a mixture thereof may be used instead of $Sr_3N_2$, and $Ca_3N_2$, $Ba_3N_2$, $Sr_2N$, SrN, and a mixture thereof may be used instead of the $Sr_3N_2$.

The starting material are weighed and mixed so as to obtain the desired composition, and the target phosphor can be obtained by burning the obtained mixture powders. For example, the technique of performing mortar mixing in a glove box can be cited as an example of the mixing. A boron nitride, a silicon nitride, a silicon carbide, carbon, an aluminum nitride, sialon, an aluminum oxide, molybdenum, or tungsten can be used as the material for the crucible.

Sixth Embodiment

A light emitting device according to a sixth embodiment differs from the light emitting device of the fifth embodiment only in that the stacked film including the transparent resin layer, the first fluorescent layer, the second fluorescent layer, and the transparent resin layer is not separately formed on the individual LED chip, but formed into a sheet shape with which the plural LED chips are collectively covered. Therefore, the description overlapping with that of the fifth embodiment is omitted.

Figure 11:
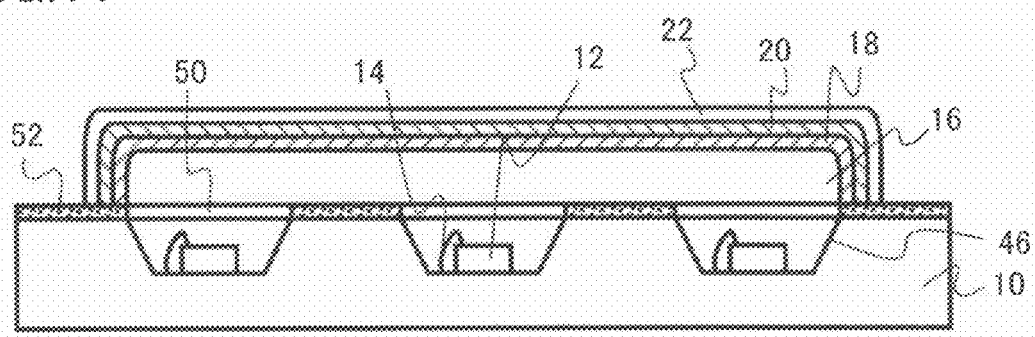
FIG. 11 is a schematic sectional view illustrating a light emitting device according to a sixth embodiment.

FIG. 11 is a schematic sectional view illustrating the light emitting device of the fourth embodiment. The stacked film including the transparent resin layer 16, the first fluorescent layer 18, the second fluorescent layer 20, and the transparent resin layer 22 is formed into the sheet shape with which the LED chips 12 are collectively covered.

FIG. 12A to FIG. 12F are schematic sectional views illustrating a method for manufacturing the light emitting device of the sixth embodiment. The blue LED chips 12 for excitation light sources are mounted on the recesses 46 in the surface of the board 10 by sealing the LED chips 12 using the transparent resin layer 48 (FIG. 12A).

The deformable resin sheet 50 having the region through which the light emitted from the LED chip 12 is transmitted is prepared. Then, a metallic mask 58 having the opening in the region where the blue LED chip 12 is mounted is placed on the resin sheet 50, and the transparent resin 26 is applied onto the mask 58 in the wide range of the mask 58 with no use of the dispenser. For example, the transparent resin 26 is a silicone resin.

The transparent resin 26 except the transparent resin 26 with which the opening is filled is removed from the surface of the mask 58 with the squeeze 28 (FIG. 12B).

Then, the mask 58 is removed from the resin sheet 50, and the resin sheet 50 is subjected to the heat treatment to cure the transparent resin 26, thereby forming the transparent resin layer 16 (FIG. 12C).

Then, a metallic mask 60 having the opening in the region where the blue LED chip 12 is mounted is placed on the resin sheet 50. The opening of the mask 60 is designed wider than that of the mask 58. The binder resin 32 in which the red phosphors are dispersed is applied onto the mask 60 in the wide range of the mask 60 with no use of the dispenser. For example, the binder resin 32 is a silicone resin.

Then, the binder resin 32 except the binder resin 32 with which the opening is filled is removed from the surface of the resin sheet 50 with the squeeze 28 (FIG. 12D).

The mask 60 is removed from the resin sheet 50, and the resin sheet 50 is subjected to the heat treatment to cure the binder resin 32, thereby forming the first fluorescent layer (FIG. 12E).

Then, the second fluorescent layer 20 and the transparent resin layer 22 are formed by repeating the similar process to produce the light emitting device illustrated in FIG. 11.

According to the sixth embodiment, the alignment of the mask with the board can be relaxed. Accordingly, productivity and yield of the light emitting device are advantageously improved.

Seventh Embodiment

A method for manufacturing a light emitting device according to a seventh embodiment is another method for manufacturing the light emitting device of the fifth embodiment illustrated in FIG. 9.

In the method for manufacturing the light emitting device of the seventh embodiment, the light emitting element that emits the light having the wavelength of 250 nm to 500 nm is mounted on the surface of the board, the deformable resin sheet having the region through which the light emitted from the light emitting element is transmitted is prepared, the resin including the phosphor having the composition expressed by the following equation (1) and the average particle diameter of 12 μm or more is applied onto the die including the recess whose diameter is larger than that of the light emitting element, the resin sheet and the die are pressed against each other while overlapping each other, the resin except the resin of the recess is removed from the surfaces of the resin sheet and die, the resin sheet and the die are separated from each other such that the resin of the recess is left, the resin sheet is subjected to the heat treatment to cure the resin, and the resin sheet is bonded such that the region is located above the light emitting element.

$$(M_{1-x1}Eu_{x1})_{3-y}Si_{13-z}Al_{3+z}O_{2+u}N_{21-w} \quad (1)$$

(In the equation (1), M is an element that is selected from IA group elements, IIA group elements, IIIA group elements IIIB group elements except Al, rare-earth elements, and IVB group elements. Eu is the emission center element. x1, y, z, u, and w satisfy the following inequalities simultaneously, that is to say each of the following inequalities is satisfied by the choice of values of the identified paramaters within the noted ranges. $0<x1<1$, $-0.1<y<0.3$, $-3<z\le1$, $-3<u-w\le1.5$, $-2<u, w<21$)

FIG. 13A to FIG. 13F are schematic sectional views illustrating a method for manufacturing the light emitting device of the seventh embodiment. The blue LED chips 12 for excitation light sources are mounted on the recesses 46 of the board 10 by sealing the LED chips 12 using the transparent resin layer 48 (FIG. 13A). Then, the die 38 having the recess whose diameter is larger than that of the blue LED chip 12 is prepared (FIG. 13B).

The deformable resin sheet 50 having the region through which the light emitted from the LED chip 12 is transmitted is prepared. As used herein, the region through which the light is transmitted means the region except the reflection layer 52 of the resin sheet 50.

Then, the transparent resin 26 is applied onto the die 38 in the wide range of the die 38 with no use of the dispenser (FIG. 13C). For example, the transparent resin 26 is a silicone resin.

The resin sheet 50 and the die 38 are pressed against each other while overlapping each other such that the region is located in the position corresponding to the recess, and the transparent resin 26 except the recess is removed from the surfaces of the resin sheet 50 and die 38 (FIG. 13D).

Then, the resin sheet 50 and the die 38 are separated from each other such that the transparent resin 26 in the portion of the die 38 is left on the resin sheet 50, and the resin sheet 50 is subjected to the heat treatment to cure the resin, thereby forming the transparent resin layer 16.

Then, the die 40 having a recess whose diameter is larger than that of the transparent resin layer 16 is prepared. The die 40 is designed such that the diameter of the die 40 is larger than that of the die 38. The binder resin 32 in which the red phosphors are dispersed is applied onto the die 40 in the wide range of the die 40 with no use of the dispenser. For example, the binder resin 32 is a silicone resin.

Then, the resin sheet 50 and the die 40 are pressed against each other while overlapping each other such that the transparent resin layer 16 is fitted in the recess, and the binder resin 32 except the recess is removed from the surfaces of the resin sheet 50 and die 40 (FIG. 13E).

Then, the resin sheet 50 and the die 40 are separated from each other such that the binder resin 32 is left on the transparent resin layer 16, and the board is subjected to the heat treatment to cure the binder resin, thereby forming the first fluorescent layer 18.

Then, the second fluorescent layer 20 and the transparent resin layer 22 are formed on the resin sheet 50 by repeating the similar process. Then, the board 10 and the resin sheet 50 are bonded such that the region through which the light is transmitted is located on the LED chip 12 (FIG. 13F). Thus, the light emitting device illustrated in FIG. 9 is produced.

The light emitting device is also produced with no use of the dispense, because the method for manufacturing the light emitting device of the seventh embodiment has the above-described configuration. Therefore, the high-efficiency light emitting device can be produced by the stable manufacturing method.

Eighth Embodiment

A method for manufacturing a light emitting device according to an eighth embodiment is another method for manufacturing the light emitting device of the sixth embodiment illustrated in FIG. 11.

FIG. 14A to FIG. 14F are schematic sectional views illustrating a method for manufacturing the light emitting device of the eighth embodiment. The blue LED chips 12 for excitation light sources are mounted on the recesses 46 of the board 10 by sealing the LED chips 12 using the transparent resin layer 48 (FIG. 14A). The die 42 having a recess is prepared, the diameter of the recess is larger than that of the blue LED chip 12, and the plural blue LED chips 12 are collectively included in the recess (FIG. 14B).

Then, the deformable resin sheet 50 having the region through which the light emitted from the LED chip 12 is transmitted is prepared.

Then, the transparent resin 26 is applied onto the die 42 in the wide range of the die 42 with no use of the dispenser (FIG. 14C). For example, the transparent resin 26 is a silicone resin.

Then, the resin sheet 50 and the die 42 are pressed against each other while overlapping each other, and the transparent resin 26 except the recess is removed from the surfaces of the resin sheet 50 and die 42 (FIG. 14D).

Then, the resin sheet 50 and the die 42 are separated from each other such that the transparent resin 26 in the portion of the die 42 is left on the resin sheet 50, and the resin sheet 50 is subjected to the heat treatment to cure the resin, thereby forming the transparent resin layer 16.

Then, the die 44 having the recess whose diameter is larger than that of the transparent resin layer 16 is prepared. The die 44 is designed such that the diameter of the die 44 are larger than that of the die 42. The binder resin 32 in which the red phosphors are dispersed is applied onto the die 42 in the wide range of the die 44 with no use of the dispenser. For example, the binder resin 32 is a silicone resin.

Then, the resin sheet 50 and the die 44 are pressed against each other while overlapping each other such that the transparent resin layer 16 is fitted in the recess, and the binder resin 32 except the recess is removed from the surfaces of the resin sheet 50 and die 44 (FIG. 14E).

Then, the resin sheet 50 and the die 44 are separated from each other such that the binder resin 32 is left on the transparent resin layer 16, and the board is subjected to the heat treatment to cure the resin, thereby forming the first fluorescent layer 18.

Then, the second fluorescent layer 20 and the transparent resin layer 22 are formed on the resin sheet 50 by repeating the similar process. Then, the board 10 and the resin sheet 50 are bonded so as to be located on the LED chip 12 (FIG. 14F). Thus, the light emitting device illustrated in FIG. 11 is produced.

The light emitting device is also produced with no use of the dispense, because the method for manufacturing the light emitting device of the eighth embodiment has the above-described configuration. Therefore, the high-efficiency light emitting device can be produced by the stable manufacturing method.

Ninth Embodiment

A light emitting device according to a ninth embodiment differs from the light emitting device of the fifth embodiment only in that the board is formed into a concave shape. Therefore, the description overlapping with that of the fifth embodiment is omitted.

Figure 15:
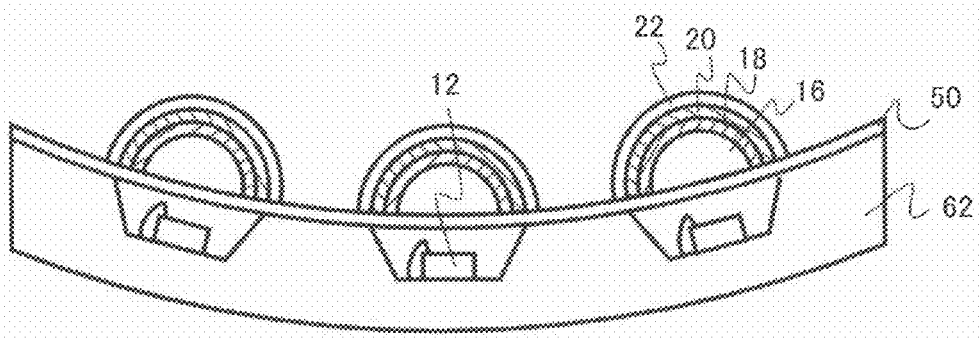
FIG. 15 is a schematic sectional view illustrating a light emitting device according to a ninth embodiment.

FIG. 15 is a schematic sectional view illustrating the light emitting device of the ninth embodiment. The LED chips 12 are mounted on a concave board 62. The high-efficiency light emitting device having the concave board 62 by the use of the deformable resin sheet 50 can be realized.

Tenth Embodiment

A light emitting device according to a tenth embodiment differs from the light emitting device of the ninth embodiment only in that the stacked film including the transparent resin layer, the first fluorescent layer, the second fluorescent layer, and the transparent resin layer is not separately formed on the individual LED chip, but formed into a sheet shape with which the plural LED chips are collectively covered. Therefore, the description overlapping with that of the ninth embodiment is omitted.

Figure 16:
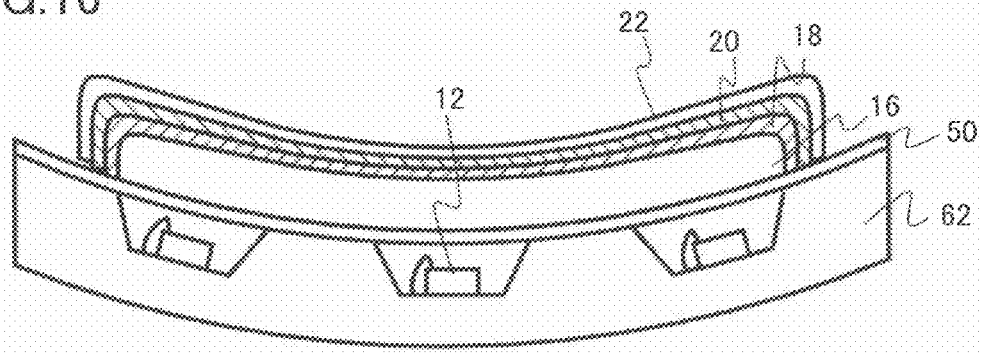
FIG. 16 is a schematic sectional view illustrating a light emitting device according to a tenth embodiment.

FIG. 16 is a schematic sectional view illustrating the light emitting device of the tenth embodiment. The LED chips 12 are mounted on the concave board 62. The stacked film including the transparent resin layer 16, the first fluorescent layer 18, the second fluorescent layer 20, and the transparent resin layer 22 is formed into the sheet shape with which the LED chips 12 are collectively covered. The high-efficiency light emitting device having the concave board 62 by the use of the deformable resin sheet 50 can be realized.

Eleventh Embodiment

Figure 17:
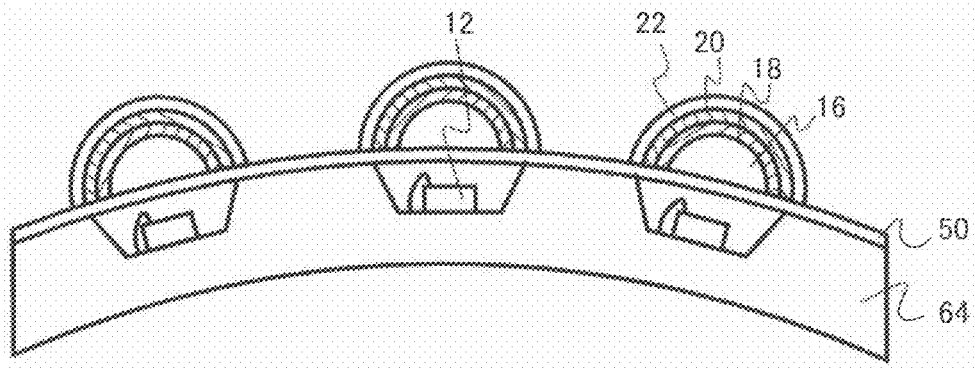
FIG. 17 is a schematic sectional view illustrating a light emitting device according to an eleventh embodiment.

A light emitting device according to an eleventh embodiment differs from the light emitting device of the fifth embodiment only in that the board is formed into a convex shape. Therefore, the description overlapping with that of the fifth embodiment is omitted. FIG. 17 is a schematic sectional view illustrating the light emitting device of the eleventh embodiment. The LED chips 12 are mounted on the convex board 62. The high-efficiency light emitting device having the convex board 64 by the use of the deformable resin sheet 50 can be realized.

Twelfth Embodiment

A light emitting device according to a twelfth embodiment differs from the light emitting device of the eleventh embodiment only in that the stacked film including the transparent resin layer, the first fluorescent layer, the second fluorescent layer, and the transparent resin layer is not separately formed on the individual LED chip, but formed into a sheet shape with which the plural LED chips are collectively covered. Therefore, the description overlapping with that of the eleventh embodiment is omitted.

Figure 18:
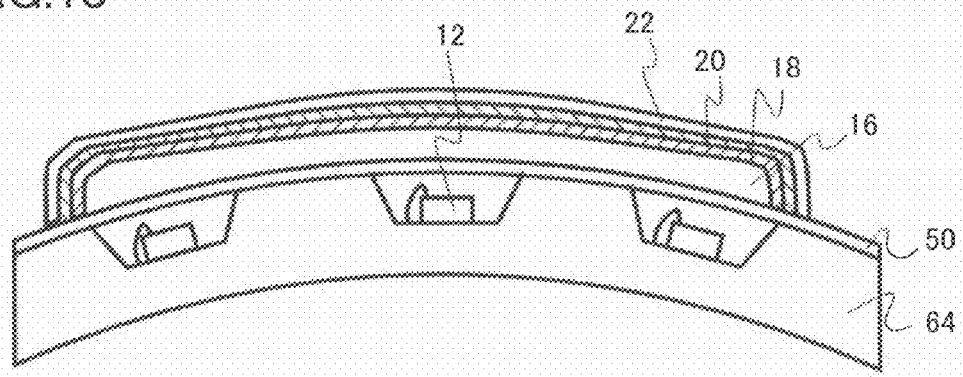
FIG. 18 is a schematic sectional view illustrating a light emitting device according to a twelfth embodiment.

FIG. 18 is a schematic sectional view illustrating the light emitting device of the twelfth embodiment. The LED chips 12 are mounted on the convex board 64. The stacked film including the transparent resin layer 16, the first fluorescent layer 18, the second fluorescent layer 20, and the transparent resin layer 22 is formed into the sheet shape with which the LED chips 12 are collectively covered. The high-efficiency light emitting device having the convex board 64 by the use of the deformable resin sheet 50.

Thirteenth Embodiment

Figure 19:
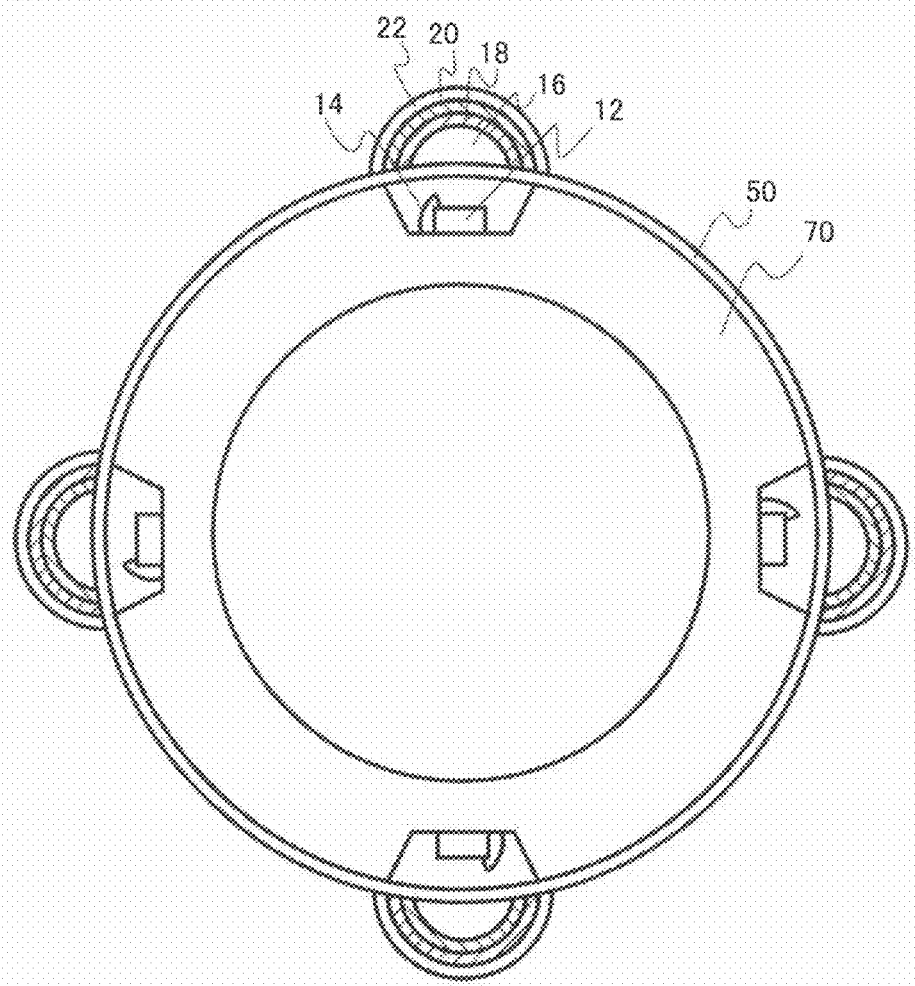
FIG. 19 is a schematic sectional view illustrating a light emitting device according to a thirteenth embodiment.

A light emitting device according to a thirteenth embodiment differs from the light emitting device of the fifth embodiment only in that the board is formed into a cylindrical shape. Therefore, the description overlapping with that of the fifth embodiment is omitted. FIG. 19 is a schematic sectional view illustrating the light emitting device of the thirteenth embodiment. The LED chips 12 are mounted on a cylindrical board 70. The high-efficiency light emitting device having the cylindrical board 70 by the use of the deformable resin sheet 50 can be realized.

Fourteenth Embodiment

A light emitting device according to a fourteenth embodiment differs from the light emitting device of the thirteenth embodiment only in that the stacked film including the transparent resin layer, the first fluorescent layer, the second fluorescent layer, and the transparent resin layer is not separately formed on the individual LED chip, but formed into a sheet shape with which the plural LED chips are collectively covered. Therefore, the description overlapping with that of the thirteenth embodiment is omitted.

Figure 20:
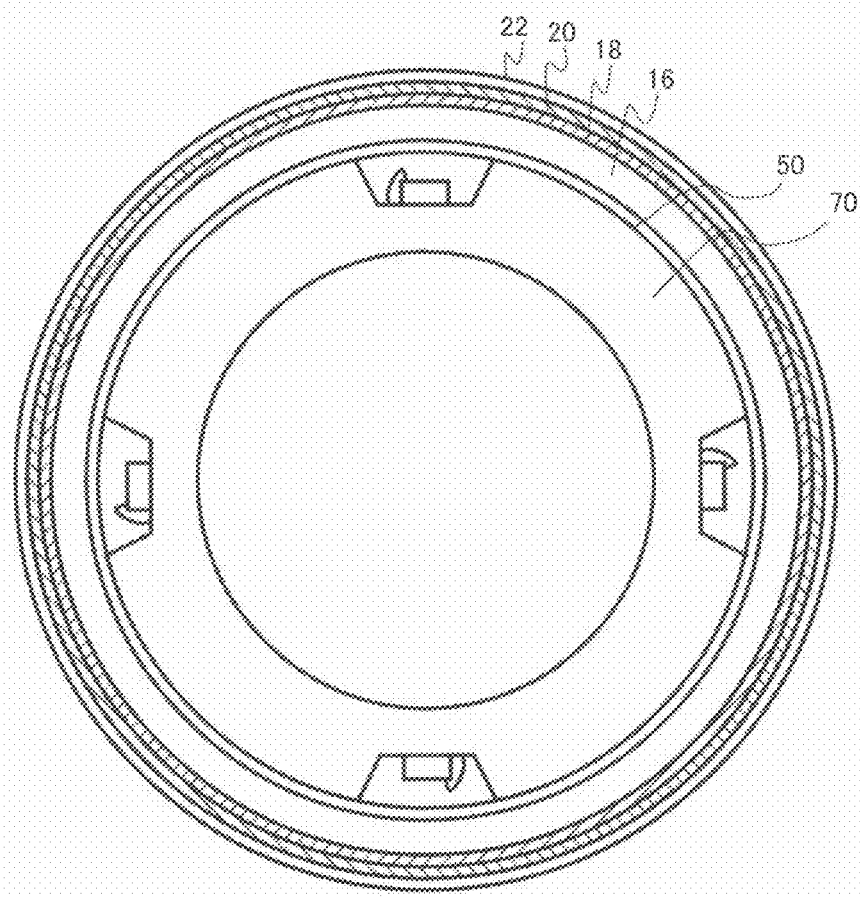
FIG. 20 is a schematic sectional view illustrating a light emitting device according to a fourteenth embodiment.

FIG. 20 is a schematic sectional view illustrating the light emitting device of the fourteenth embodiment. The LED chips 12 are mounted on the cylindrical board 70. The stacked film including the transparent resin layer 16, the first fluorescent layer 18, the second fluorescent layer 20, and the transparent resin layer 22 is formed into the sheet shape with which the LED chips 12 are collectively covered.

While certain embodiments have been described, these embodiments have been presented by way of example only, and are not intended to limit the scope of the inventions. Indeed, the light emitting device and the light emitting device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, a semiconductor light emitting device that emits the light in the ultraviolet region or the blue light may be used as the light emitting element that emits the excitation light used in the light emitting device. Although the LED in which the gallium nitride compound semiconductor is described in the embodiments and examples, the LED is not limited to the gallium nitride compound semiconductor.

When the blue LED is used as the light emitting element, the phosphor is not limited to the yellow phosphor, the combination of the yellow phosphor and the red phosphor, the combination of the red phosphor and the green phosphor, the combination of the red phosphor, the yellow phosphor, and the green phosphor, but the combination of the orange phosphor and the green phosphor, the combination of the red phosphor and the blue-green phosphor, and the combination of the orange phosphor and the blue-green phosphor may be used as the phosphor. When the near-ultraviolet LED is used as the phosphor, the combination of the red phosphor and the green phosphor and the combination of the red phosphor, the yellow phosphor, the green phosphor, and the blue phosphor may be used as the light emitting element. When at least two kinds of the phosphors are used, preferably a multi-layer structure application in which the phosphor emitting the longer-wavelength light is applied inside while the phosphor emitting the shorter-wavelength light is applied outside is adopted in order to prevent re-absorption between the phosphors. More preferably a multi-layer structure application in which the transparent resin layer is sandwiched between the phosphor emitting the longer-wavelength light and the phosphor emitting the shorter-wavelength light is adopted.

In the embodiments, the red phosphor and the green phosphor are individually included in the different fluorescent layers by way of example. Alternatively, the red phosphor and the green phosphor may be mixed and included in the same fluorescent layer.

In the embodiments, the sialon phosphor is applied to the red phosphor by way of example. From the viewpoint of suppressing the thermal quenching, desirably sialon phosphor, particularly, the phosphor expressed by the equation (2) is applied to the red phosphor. Alternatively, another red phosphor may be applied.

Any binder resin can be used as the binder resin that constitutes the base material of the sealing resin as long as the binder resin is substantially transparent in the neighborhood of the peak wavelength of the light emitting element (excitation element) and the wavelength range longer than the peak wavelength of the light emitting element. Generally examples of the binder resin include a silicone resin, an epoxy resin, a polydimethylcyclohexan derivative having a epoxy group, an oxetane resin, an acrylic resin, a cycloolefin resin, a urea resin, a fluorine resin, and a polyimide resin.

In the following examples and comparative examples, M in the equation (1) and M' in the equation (2) are Sr (strontium).

Example 1

The light emitting device of the fifth embodiment illustrated in FIG. 9 was produced by the method for manufacturing the light emitting device of the fifth embodiment illustrated in FIG. 10. At this point, the green phosphor having the composition, peak wavelength, and average particle diameter, which are illustrated in a field of Example 1 of TABLE 1, was applied to the second fluorescent layer (green fluorescent layer). At this point, the red phosphor having the composition, peak wavelength, and average particle diameter, which are illustrated in a field of Example 1 of TABLE 2, was applied to the first fluorescent layer (red fluorescent layer). A total luminous flux, which was obtained by driving the light emitting device of Example 1 at 800 mA, was evaluated using an integrating sphere. TABLE 3 illustrates the result. The single phosphor was irradiated with the excitation light of the blue LED, and the wavelength of the emitted light was measured to evaluate the peak wavelength.

TABLE 1 illustrates values of x1, y, z, u, and w in the equation (1). TABLE 2 illustrates values of x2, a, b, c, and d in the equation (2).

TABLE 1

|  | x1 | y | z | u | w | Peak Wavelength (nm) | Average Particle Diameter (µm) |
|---|---|---|---|---|---|---|---|
| Example 1 | 0.10 | −0.08 | 0.11 | −0.04 | 1.43 | 524 | 51 |
| Example 2 | 0.08 | −0.06 | 0.13 | 0.22 | 0.06 | 518 | 53 |
| Example 3 | 0.10 | −0.08 | 0.03 | −0.06 | 0.09 | 517 | 54 |
| Example 4 | 0.07 | −0.07 | −0.23 | −0.03 | 0.79 | 511 | 60 |
| Example 5 | 0.07 | −0.07 | −0.23 | −0.03 | 0.79 | 511 | 53 |
| Example 6 | 0.10 | −0.08 | 0.11 | −0.04 | 1.43 | 516 | 80 |
| Comparative Example 1 | 0.1 | −0.08 | 0.11 | −0.04 | 1.43 | 524 | 5 |
| Comparative Example 2 | 0.1 | −0.08 | 0.11 | −0.04 | 1.43 | 524 | 10 |

TABLE 2

|  | x2 | a | b | c | d | Peak Wavelength (nm) |
|---|---|---|---|---|---|---|
| Example 1 | 0.10 | 0.858 | 3.34 | 0.350 | 4.92 | 622 |
| Example 2 | 0.11 | 0.935 | 3.41 | 0.418 | 5.18 | 631 |
| Example 3 | 0.15 | 0.911 | 3.70 | 0.272 | 5.63 | 642 |
| Example 4 | 0.08 | 0.680 | 2.54 | 0.332 | 4.29 | 616 |
| Example 5 | 0.09 | 0.680 | 2.54 | 0.332 | 4.29 | 616 |
| Example 6 | 0.10 | 0.858 | 3.34 | 0.350 | 4.92 | 622 |
| Comparative Example 1 | 0.10 | 0.858 | 3.34 | 0.350 | 4.92 | 622 |
| Comparative Example 2 | 0.10 | 0.858 | 3.34 | 0.350 | 4.92 | 622 |

The method for manufacturing the light emitting device of Example 1 will be described with reference to FIG. 9 and FIG. 10.

An InGaN compound semiconductor was used as an active layer, and 16 blue LED chips 12 (FIG. 10) in which p-side/n-side electrodes were formed were prepared. The blue LED chip 12 is fixed to each of the plural recesses 46 of the flat-type mounting board 10 that is the stacked board of patterned Cu metal and an insulating layer by using Sn—Ag—Cu paste. The patterned Cu metal constitutes a lead electrode.

Figure 21:
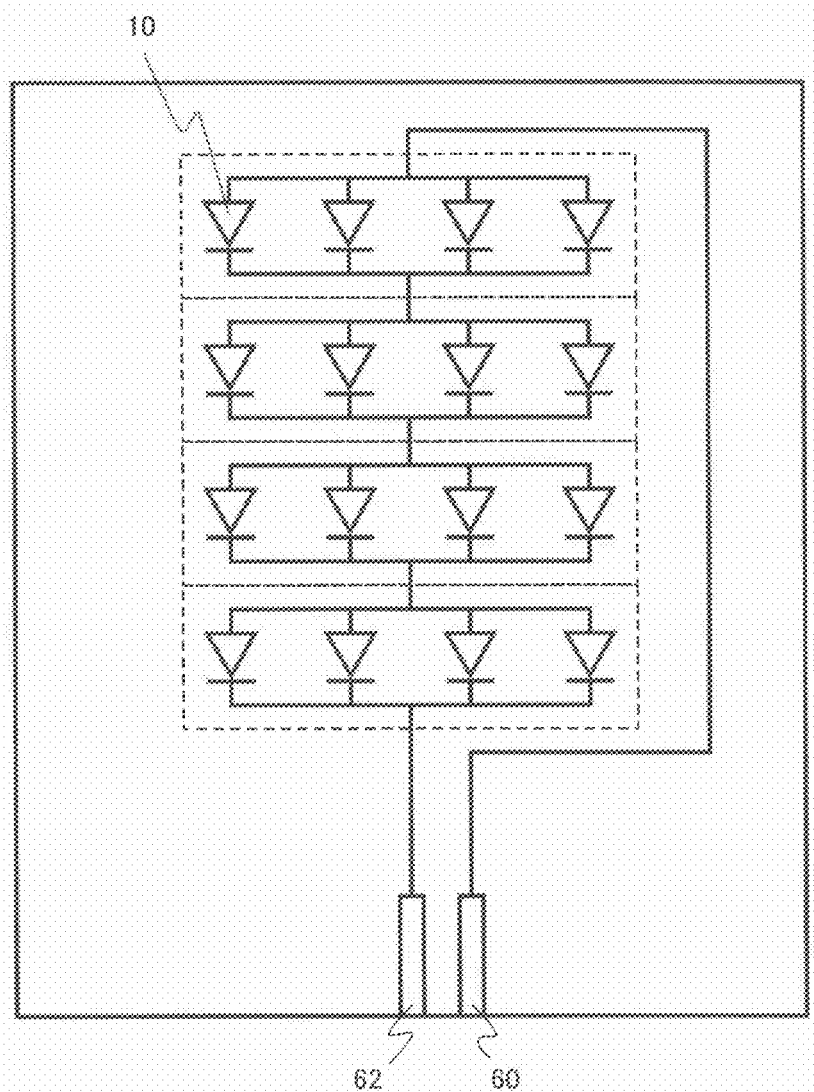
FIG. 21 is a wiring diagram of an LED chip of Example 1.

FIG. 21 is a wiring diagram of an LED chip of Example 1. As illustrated in FIG. 21, the fixed LED chips 12 are connected so as to become 4-by-4 array, and an anode electrode 60 and a cathode electrode 62 are formed. At this point, the lead electrode on the anode side and the p-side electrode of the blue LED chip 12 are electrically connected by the Au wire 14 (FIG. 10), and the lead electrode on the cathode side and the n-side electrode of the blue LED chip 12 are electrically connected through Sn—Ag—Cu paste. Then, the LED chips 12 are sealed by applying the silicone resin, thereby protecting the Au wire 14.

On the other hand, the silicone thin-film resin sheet 50 is loaded on a vacuum printing apparatus. In the resin sheet 50, the region where the LED chips 12 are located is transparent, and the reflection layer 52 in which Ag fine particles are dispersed is formed in other portions. The resin sheet 50 has a thickness of 0.1 mm, and a bonding agent is applied to only one side of the resin sheet 50.

Using the metal mask 54 whose opening diameter ranges from 1 mmφ to 3 mmφ, the silicone transparent resin 26 is formed into the hemispherical shape on the resin sheet 50 through a first-time printing process while the silicone transparent resin is defoamed at low pressure. Then, the resin sheet 50 in which the transparent resin 26 is formed is cured by retaining the resin sheet 50 at 150° C. for 30 minutes, thereby forming the transparent resin layer 16.

Then, at the silicone resin which is the binder resin, using the metal mask 56 whose opening diameter is slightly larger than that of the first-time printing process, the resin 32 in which the red phosphors illustrated in the field of Example 1 of TABLE 2 are dispersed is formed into the hemispherical shape with an even thickness through a second-time printing process such that the whole of the hemispherical transparent resin layer 16 formed through the first-time printing process is covered with the resin. Then, the resin sheet 50 is cured by retaining the resin sheet 50 at 150° C. for 30 minutes at normal pressure in the atmosphere, thereby forming the first fluorescent layer 18.

Then, using the metal mask whose opening diameter is slightly larger than that of the second-time printing process, the resin in which the green phosphors illustrated in the field of Example 1 of TABLE 1 are dispersed is formed into the hemispherical shape with the even thickness through a third-time printing process such that the whole of the hemispherical first fluorescent layer 18 formed through the second-time printing process is covered with the resin. Then, the resin sheet 50 is cured by retaining the resin sheet 50 at 150° C. for 30 minutes at normal pressure in the atmosphere, thereby forming the second fluorescent layer 20. Therefore, the stacked structure including the transparent resin layer 16, the first fluorescent layer 18, and the second fluorescent layer 20 becomes the hemispherical shape.

Then, using the metal mask whose opening diameter is slightly larger than that of the third-time printing process, the silicone transparent resin is formed with the even thickness through a fourth-time printing process such that the second fluorescent layer 20 applied through the third-time printing process is covered with the silicone transparent resin. The transparent resin is formed through the fourth-time printing process such that a ratio (=a/b) of a layer thickness a in a direction immediately above the LED chip and a layer thickness b in the lateral direction becomes 1.0.

Then, the transparent resin applied through the fourth-time printing process is cured by retaining the transparent resin at 150° C. for 30 minutes, and drying at normal pressure whereby the transparent resin layer 22 is formed to prepare the phosphor application sheet having the multi-layer structure. Therefore, the stacked structure including the transparent resin layer 16, the first fluorescent layer 18, the second fluorescent layer 20, and the transparent resin layer 22 becomes the hemispherical shape.

After the residual atmosphere is removed in a reduced-pressure chamber, the phosphor application sheet (resin sheet) is bonded to the flat-type mounting board 10 to prepare the light emitting device illustrated in FIG. 9.

Examples 2 to 6

The light emitting devices were produced in the way similar to that of Example 1 except that the green phosphors having the compositions, peak wavelengths, and average particle diameters, which are illustrated in fields of Examples 2 to 6 of TABLE 1, were applied to the second fluorescent layer and except that the red phosphors having the compositions and peak wavelengths, which are illustrated in fields of Examples 2 to 6 of TABLE 2, were applied to the first fluorescent layer. The evaluations similar to that of Example 1 were performed. TABLE 3 illustrates the result.

Comparative Examples 1 and 2

The light emitting devices were produced in the way similar to that of Example 1 except that the green phosphors having the compositions, peak wavelengths, and average particle diameters, which are illustrated in fields of Comparative examples 1 and 2 of TABLE 1, were applied to the second fluorescent layer and except that the red phosphors having the compositions and peak wavelengths, which are illustrated in fields of Comparative examples 1 and 2 of TABLE 2, were applied to the first fluorescent layer. The evaluations similar to that of Example 1 were performed. TABLE 3 illustrates the result.

It was confirmed that Examples 1 to 6 having the average particle diameter of 12 μm or more are higher than Comparative examples 1 and 2 in the luminous flux. The high-luminance flat-type light emitting devices were obtained by Examples 1 to 6. When a continuous lighting test was performed while the light emitting devices of Examples 1 to 6 were joined to heat sinks, the decrease in luminous flux caused by heat accumulation was able to be suppressed. Accordingly, the light emitting devices of Examples 1 to 6 had the small color shift, high luminance, high efficiency, and excellent heat-radiation performance.

TABLE 3

|  | Total Luminous Flux (Normalized) |
| --- | --- |
| Example 1 | 94 |
| Example 2 | 96 |
| Example 3 | 97 |
| Example 4 | 93 |
| Example 5 | 100 |
| Example 6 | 88 |

TABLE 3-continued

|  | Total Luminous Flux (Normalized) |
| --- | --- |
| Comparative Example 1 | 65 |
| Comparative Example 2 | 80 |

Example 7

The light emitting device of the fifth embodiment illustrated in FIG. 9 was produced by the method for manufacturing the light emitting device of the seventh embodiment illustrated in FIG. 13. At this point, the green phosphor having the composition, peak wavelength, and average particle diameter, which are illustrated in the field of Example 7 of TABLE 4, was applied to the second fluorescent layer. The red phosphor having the composition and peak wavelength, which are illustrated in the field of Example 7 of TABLE 5, was applied to the first fluorescent layer.

The total luminous flux, which was obtained by driving the light emitting device of Example 7 at 800 mA, was evaluated using the integrating sphere. TABLE 6 illustrates the result. The single phosphor was irradiated with the excitation light of the blue LED, and the wavelength of the emitted light was measured to evaluate the peak wavelength.

TABLE 1 illustrates values of x1, y, z, u, and w in the equation (1). TABLE 2 illustrates values of x2, a, b, c, and d in the equation (2).

TABLE 4

|  | x1 | y | z | u | w | Peak Wavelength (nm) | Average Particle Diameter (μm) |
| --- | --- | --- | --- | --- | --- | --- | --- |
| Example 7 | 0.10 | −0.08 | 0.11 | −0.04 | 1.43 | 524 | 51 |
| Example 8 | 0.08 | −0.06 | 0.13 | 0.22 | 0.06 | 518 | 53 |
| Example 9 | 0.10 | −0.08 | 0.03 | −0.06 | 0.09 | 520 | 60 |
| Example 10 | 0.1 | −0.08 | 0.11 | −0.04 | 1.43 | 524 | 51 |
| Example 11 | 0.08 | −0.06 | −0.15 | 0.11 | −0.11 | 516 | 80 |
| Example 12 | 0.1 | −0.08 | 0.11 | −0.04 | 1.43 | 524 | 45 |
| Comparative Example 3 | 0.08 | −0.07 | −0.23 | −0.03 | 0.79 | 511 | 5 |

TABLE 5

|  | x2 | a | b | c | d | Peak Wavelength (nm) |
| --- | --- | --- | --- | --- | --- | --- |
| Example 7 | 0.10 | 0.858 | 3.34 | 0.350 | 4.92 | 622 |
| Example 8 | 0.11 | 0.935 | 3.41 | 0.418 | 5.18 | 631 |
| Example 9 | 0.15 | 0.911 | 3.70 | 0.272 | 5.63 | 642 |
| Example 10 | 0.08 | 0.680 | 2.54 | 0.332 | 4.29 | 616 |
| Example 11 | 0.09 | 0.680 | 2.54 | 0.332 | 4.29 | 616 |
| Example 12 | 0.10 | 0.858 | 3.34 | 0.350 | 4.92 | 622 |
| Comparative Example 3 | 0.10 | 0.858 | 3.34 | 0.350 | 4.92 | 622 |

The method for manufacturing the light emitting device of Example 7 will be described with reference to FIG. 9 and FIG. 13.

The InGaN compound semiconductor was used as the active layer, and 16 blue LED chips 12 (FIG. 13) in which p-side/n-side electrodes were formed were prepared. The blue LED chip 12 is fixed to each of the plural recesses 46 of the flat-type mounting board 10 that is the stacked board of the patterned Cu metal and the insulating layer by using Sn—Ag—Cu paste. The patterned Cu metal constitutes the lead electrode.

As illustrated in FIG. 21, similarly to Example 1, the fixed LED chips 12 are connected so as to become the 4-by-4 array, and the anode electrode 60 and the cathode electrode 62 are formed. At this point, the lead electrode on the anode side and the p-side electrode of the blue LED chip 12 are electrically connected by the Au wire 14 (FIG. 13), and the lead electrode on the cathode side and the n-side electrode of the blue LED chip 12 are electrically connected through Sn—Ag—Cu paste. Then, the LED chips 12 are sealed by applying the silicone resin, thereby protecting the Au wire 14.

On the other hand, the silicone thin-film resin sheet 50 is loaded on the molding apparatus. In the resin sheet 50, the region where the LED chips 12 are located is transparent, and the reflection layer 52 in which Ag fine particles are dispersed is formed in other portions. The resin sheet 50 has the thickness of 0.1 mm, and the bonding agent is applied to only one side of the resin sheet 50.

Using the hemispherical die 38 whose diameter ranges from 1 mmφ to 3 mmφ, the silicone transparent resin 26 is formed into the hemispherical shape on the resin sheet 50 through a first-time molding process while the silicone transparent resin 26 is defoamed at low pressure. Then, the resin sheet 50 in which the transparent resin 26 is formed is cured by retaining the resin sheet 50 at 150° C. for 30 minutes at normal pressure, thereby forming the transparent resin layer 16.

Then, at the silicone resin which is the binder resin, using the die 40 whose opening diameter is slightly larger and deeper than that of the first-time printing process, the resin 32 in which the red phosphors illustrated in the field of Example 7 of TABLE 5 are dispersed is formed into the hemispherical shape with the even thickness through a second-time molding process such that the whole of the hemispherical transparent resin layer 16 formed through the first-time molding process is covered with the resin 32. Then, the resin sheet 50 is cured by retaining the resin sheet 50 at 150° C. for 30 minutes at normal pressure in the atmosphere, thereby forming the first fluorescent layer 18.

Then, using the die whose opening diameter is slightly larger and deeper than that of the second-time molding process, the resin in which the green phosphors illustrated in the field of Example 7 of TABLE 4 are dispersed is formed into the hemispherical shape with the even thickness through a third-time molding process such that the whole of the hemispherical first fluorescent layer 18 formed through the second-time molding process is covered with the resin. Then, the resin sheet 50 is cured by retaining the resin sheet 50 at 150° C. for 30 minutes at normal pressure in the atmosphere, thereby forming the second fluorescent layer 20. Therefore, the stacked structure including the transparent resin layer 16, the first fluorescent layer 18, and the second fluorescent layer 20 becomes the hemispherical shape.

Then, using the die whose opening diameter is slightly larger and deeper than that of the third-time molding process, the silicone transparent resin is formed with the even thickness through a fourth-time molding process such that the second fluorescent layer 20 applied through the third-time molding process is covered with the silicone transparent resin. The transparent resin is formed through the fourth-time molding process such that the ratio (=a/b) of the layer thickness a in the direction immediately above the LED chip and the layer thickness b in the lateral direction becomes 1.0.

Then, the transparent resin applied through the fourth-time molding process is cured by retaining the transparent resin at 150° C. for 30 minutes, and drying at normal pressure whereby the transparent resin layer 22 is formed to prepare the phosphor application sheet having the multi-layer structure. Therefore, the stacked structure including the transparent resin layer 16, the first fluorescent layer 18, the second fluorescent layer 20, and the transparent resin layer 22 becomes the hemispherical shape.

After the residual atmosphere is removed in the reduced-pressure chamber, the phosphor application sheet (resin sheet) is bonded to the flat-type mounting board 10 to prepare the light emitting device illustrated in FIG. 9.

Examples 8 to 12

The light emitting devices were produced in the way similar to that of Example 7 except that the green phosphors having the compositions, peak wavelengths, and average particle diameters, which are illustrated in fields of Examples 8 to 12 of TABLE 4, were applied to the second fluorescent layer and except that the red phosphors having the compositions and peak wavelengths, which are illustrated in fields of Examples 8 to 12 of TABLE 5, were applied to the first fluorescent layer. The evaluations similar to that of Example 7 were performed. TABLE 6 illustrates the result.

Comparative Example 3

The light emitting devices were produced in the way similar to that of Example 7 except that the green phosphors having the compositions, peak wavelengths, and average particle diameters, which are illustrated in fields of Comparative example 3 of TABLE 4, were applied to the second fluorescent layer and except that the red phosphors having the compositions and peak wavelengths, which are illustrated in fields of Comparative example 3 of TABLE 5, were applied to the first fluorescent layer. The evaluations similar to that of Example 7 were performed. TABLE 6 illustrates the result.

It was confirmed that Examples 7 to 12 having the average particle diameter of 12 μm or more are higher than Comparative example 3 in the luminous flux. The high-luminance flat-type light emitting devices were obtained by Examples 7 to 12. When a continuous lighting test was performed while the light emitting devices of Examples 7 to 12 were joined to heat sinks, the decrease in luminous flux caused by heat accumulation was able to be suppressed. Accordingly, the light emitting devices of Examples 7 to 12 had the small color shift, high luminance, high efficiency, and excellent heat-radiation performance.

TABLE 6

|  | Total Luminous Flux (Normalized) |
|---|---|
| Example 7 | 95 |
| Example 8 | 94 |
| Example 9 | 96 |
| Example 10 | 92 |
| Example 11 | 100 |
| Example 12 | 86 |
| Comparative Example 3 | 59 |

Comparative Examples 4 to 6

The light emitting device of the fifth embodiment illustrated in FIG. 9 was to be produced by adopting the method for manufacturing the light emitting device of the seventh embodiment illustrated in FIG. 13. At this point, the green phosphor having the composition, peak wavelength, and average particle diameter, which are illustrated in the fields of Comparative Examples 4 to 6 of TABLE 7, was applied to the second fluorescent layer. The red phosphor having the composition and peak wavelength, which are illustrated in the fields of Comparative Examples 4 to 6 of TABLE 8, was applied to the first fluorescent layer.

TABLE 7 illustrates values of x1, y, z, u, and w in the equation (1). TABLE 8 illustrates values of x2, a, b, c, and d in the equation (2).

The phosphors of Comparative examples 4 to 6 of TABLE 7 and the phosphors of Comparative examples 4 and 5 of TABLE 8 do not satisfy the conditions of the equations (1) and (2), although Comparative examples 4 to 6 of TABLE 7 and Comparative examples 4 and 5 of TABLE 8 are made based on the sialon compounds. Comparative example 6 of TABLE 8 is not made based on the sialon compound.

TABLE 7

|  | x1 | y | z | u | w | Peak Wavelength (nm) |
|---|---|---|---|---|---|---|
| Comparative Example 4 | 0.080 | 0.031 | 1.457 | 2.992 | 4.153 | Weak emission |
| Comparative Example 5 | 0.080 | −0.105 | 0.048 | 3.120 | 3.964 | Weak emission |
| Comparative Example 6 | 0.085 | −0.185 | −0.037 | 0.400 | −5.015 | Includes blue-emission |

TABLE 8

|  | x2 | a | b | c | d | Peak Wavelength (nm) |
|---|---|---|---|---|---|---|
| Comparative Example 4 | 0.50 | 0.350 | 4.61 | 0.613 | 2.23 | Weak emission |
| Comparative Example 5 | 0.14 | 1.12 | 1.35 | 0.580 | 6.34 | Weak emission |
| Comparative Example 6 | 0.02 | 0.924 | 1.01 | 0.40 | 2.68 | Different crystal structure |

As illustrated in TABLES 7 and 8, because the light emission is weak and insufficient for manufacturing the light emitting device in any phosphor, the light emitting device was not produced using the phosphors illustrated in TABLES 7 and 8.

Example 13

The light emitting device of the sixth embodiment illustrated in FIG. 11 was produced by the method for manufacturing the light emitting device of the sixth embodiment illustrated in FIG. 12. At this point, the green phosphor having the composition, peak wavelength, and average particle diameter, which are illustrated in the field of Example 13 of TABLE 9, was applied to the second fluorescent layer. The red phosphor having the composition and peak wavelength, which are illustrated in the field of Example 13 of TABLE 10, was applied to the first fluorescent layer.

The total luminous flux, which was obtained by driving the light emitting device of Example 13 at 800 mA, was evaluated using the integrating sphere. TABLE 11 illustrates the result. The single phosphor was irradiated with the excitation light of the blue LED, and the wavelength of the emitted light was measured to evaluate the peak wavelength.

TABLE 1 illustrates values of x1, y, z, u, and w in the equation (1). TABLE 2 illustrates values of x2, a, b, c, and d in the equation (2).

TABLE 9

|  | x1 | y | z | u | w | Peak Wavelength (nm) | Average Particle Diameter |
|---|---|---|---|---|---|---|---|
| Example 13 | 0.10 | −0.08 | 0.11 | −0.04 | 1.43 | 524 | 51 |
| Example 14 | 0.08 | −0.06 | 0.13 | 0.22 | 0.06 | 518 | 53 |
| Example 15 | 0.10 | −0.08 | 0.03 | −0.06 | 0.09 | 520 | 60 |
| Example 16 | 0.07 | −0.07 | −0.23 | −0.03 | 0.79 | 511 | 53 |
| Example 17 | 0.08 | −0.06 | −0.15 | 0.11 | −0.11 | 516 | 80 |
| Example 18 | 0.10 | −0.08 | 0.11 | −0.04 | 1.43 | 524 | 45 |
| Comparative Example 7 | 0.08 | −0.07 | −0.23 | −0.03 | 0.79 | 511 | 5 |

TABLE 10

|  | x2 | a | b | c | d | Peak Wavelength (nm) |
|---|---|---|---|---|---|---|
| Example 13 | 0.10 | 0.858 | 3.34 | 0.350 | 4.92 | 622 |
| Example 14 | 0.11 | 0.935 | 3.41 | 0.418 | 5.18 | 631 |
| Example 15 | 0.15 | 0.911 | 3.70 | 0.272 | 5.63 | 642 |
| Example 16 | 0.08 | 0.680 | 2.54 | 0.332 | 4.29 | 616 |
| Example 17 | 0.09 | 0.680 | 2.54 | 0.332 | 4.29 | 616 |
| Example 18 | 0.10 | 0.858 | 3.34 | 0.350 | 4.92 | 622 |
| Comparative Example 7 | 0.10 | 0.858 | 3.34 | 0.350 | 4.92 | 622 |

The method for manufacturing the light emitting device of Example 13 will be described below with reference to FIG. 11 and FIG. 12.

The InGaN compound semiconductor was used as the active layer, and 16 blue LED chips 12 (FIG. 12) in which p-side/n-side electrodes were formed were prepared. The blue LED chip 12 is fixed to each of the plural recesses 46 of the flat-type mounting board 10 that is the stacked board of the patterned Cu metal and the insulating layer by using Sn—Ag—Cu paste. The patterned Cu metal constitutes the lead electrode.

As illustrated in FIG. 21, the fixed LED chips 12 are connected so as to become the 4-by-4 array, and the anode electrode 60 and the cathode electrode 62 are formed. At this point, the lead electrode on the anode side and the p-side electrode of the blue LED chip 12 are electrically connected by the Au wire 14 (FIG. 11), and the lead electrode on the cathode side and the n-side electrode of the blue LED chip 12 are electrically connected through the Sn—Ag—Cu paste. Then, the LED chips 12 are sealed by applying the silicone resin, thereby protecting the Au wire 14.

On the other hand, the silicone thin-film resin sheet 50 is loaded on a vacuum printing apparatus. In the resin sheet 50, the region where the LED chips 12 are located is transparent, and the reflection layer 52 in which Ag fine particles are dispersed is formed in other portions. The resin sheet 50 has the thickness of 0.1 mm, and the bonding agent is applied to only one side of the resin sheet 50.

Using the metal mask 58 whose opening diameter ranges from 25 mm to 30 mm, the silicone transparent resin 26 is formed into the flat shape at low pressure on the resin sheet 50 through the first-time printing process while the silicone transparent resin is defoamed. Then, the resin sheet 50 in which the transparent resin 26 is formed is cured by retaining the resin sheet 50 at 150° C. for 30 minutes, thereby forming the transparent resin layer 16.

Then, at the silicone resin which is the binder resin, using the metal mask 60 whose opening diameter is slightly larger than that of the first-time printing process, the resin 32 in which the red phosphors illustrated in the field of Example 13 of TABLE 10 are dispersed is formed into the flat shape with the even thickness through the second-time printing process such that the whole of the flat transparent resin layer 16 formed through the first-time printing process is covered with the resin 32. Then, the resin sheet 50 is cured by retaining the resin sheet 50 at 150° C. for 30 minutes at normal pressure in the atmosphere, thereby forming the first fluorescent layer 18.

Then, using the metal mask whose opening diameter is slightly larger than that of the second-time printing process, the resin in which the green phosphors illustrated in the field of Example 13 of TABLE 9 are dispersed is formed into the flat shape with the even thickness through the third-time printing process such that the whole of the flat first fluorescent layer 18 formed through the second-time printing process is covered with the resin. Then, the resin sheet 50 is cured by retaining the resin sheet 50 at 150° C. for 30 minutes at normal pressure in the atmosphere, thereby forming the second fluorescent layer 20. Therefore, the stacked structure including the transparent resin layer 16, the first fluorescent layer 18, and the second fluorescent layer 20 becomes the flat shape.

Then, using the metal mask whose opening diameter is slightly larger than that of the third-time printing process, the silicone transparent resin is formed with the even thickness through the fourth-time printing process such that the second fluorescent layer 20 applied through the third-time printing process is covered with the silicone transparent resin. The transparent resin is formed through the fourth-time printing process such that the ratio (=a/b) of a layer thickness a in the direction immediately above the LED chip and the layer thickness b in the lateral direction becomes 1.0.

Then, the transparent resin applied through the fourth-time printing process is cured by retaining the transparent resin at 150° C. for 30 minutes, and drying at normal pressure whereby the transparent resin layer 22 is formed to prepare the phosphor application sheet having the multi-layer structure. Therefore, the stacked structure including the transparent resin layer 16, the first fluorescent layer 18, the second fluorescent layer 20, and the transparent resin layer 22 becomes the flat shape.

After the residual atmosphere is removed in the reduced-pressure chamber, the phosphor application sheet (resin sheet) is bonded to the flat-type mounting board 10 to prepare the light emitting device illustrated in FIG. 11.

Examples 14 to 18

The light emitting devices were produced in the way similar to that of Example 13 except that the green phosphors having the compositions, peak wavelengths, and average particle diameters, which are illustrated in fields of Examples 14 to 18 of TABLE 9, were applied to the second fluorescent layer and except that the red phosphors having the compositions and peak wavelengths, which are illustrated in fields of Examples 14 to 18 of TABLE 10, were applied to the first fluorescent layer. The evaluations similar to that of Example 13 were performed. TABLE 11 illustrates the result.

Comparative Example 7

The light emitting device was produced in the way similar to that of Example 13 except that the green phosphors having the compositions, peak wavelengths, and average particle diameters, which are illustrated in fields of Comparative example 7 of TABLE 9, were applied to the second fluorescent layer and except that the red phosphors having the compositions and peak wavelengths, which are illustrated in fields of Comparative example 7 of TABLE 10, were applied to the first fluorescent layer. The evaluations similar to that of Example 13 were performed. TABLE 11 illustrates the result.

It was confirmed that Examples 13 to 18 having the average particle diameter of 12 μm or more are higher than Comparative example 7 in the luminous flux. The high-luminance flat-type light emitting devices were obtained by Examples 13 to 18. When a continuous lighting test was performed while the light emitting devices of Examples 13 to 18 were joined to heat sinks, the decrease in luminous flux caused by heat accumulation was able to be suppressed. Accordingly, the light emitting devices of Examples 13 to 18 had the small color shift, high luminance, high efficiency, and excellent heat-radiation performance.

TABLE 11

| | Total Luminous Flux (Normalized) |
|---|---|
| Example 13 | 94 |
| Example 14 | 96 |
| Example 15 | 98 |
| Example 16 | 93 |
| Example 17 | 100 |
| Example 18 | 88 |
| Comparative Example 7 | 61 |

Example 19

The light emitting device of the sixth embodiment illustrated in FIG. 11 was produced by the method for manufacturing the light emitting device of the eighth embodiment illustrated in FIG. 14. At this point, the green phosphor having the composition, peak wavelength, and average particle diameter, which are illustrated in the field of Example 19 of TABLE 12, was applied to the second fluorescent layer. The red phosphor having the composition and peak wavelength, which are illustrated in the field of Example 19 of TABLE 13, was applied to the first fluorescent layer.

The total luminous flux, which was obtained by driving the light emitting device of Example 19 at 800 mA, was evaluated using the integrating sphere. TABLE 14 illustrates the result. The single phosphor was irradiated with the excitation light of the blue LED, and the wavelength of the emitted light was measured to evaluate the peak wavelength.

TABLE 1 illustrates values of x1, y, z, u, and w in the equation (1). TABLE 2 illustrates values of x2, a, b, c, and d in the equation (2).

TABLE 12

| | x1 | y | z | u | w | Peak Wavelength (nm) | Average Particle Diameter (μm) |
|---|---|---|---|---|---|---|---|
| Example 19 | 0.1 | −0.08 | 0.11 | −0.04 | 1.43 | 524 | 51 |
| Example 20 | 0.08 | −0.06 | 0.13 | 0.22 | 0.06 | 518 | 53 |
| Example 21 | 0.10 | −0.08 | 0.03 | −0.06 | 0.09 | 520 | 60 |
| Example 22 | 0.07 | −0.07 | −0.23 | −0.03 | 0.79 | 511 | 53 |
| Example 23 | 0.08 | −0.06 | −0.15 | 0.11 | −0.11 | 516 | 80 |
| Example 24 | 0.1 | −0.08 | 0.11 | −0.04 | 1.43 | 524 | 45 |
| Comparative Example 8 | 0.08 | −0.07 | −0.23 | −0.03 | 0.79 | 511 | 5 |

TABLE 13

| | x2 | a | b | c | d | Peak Wavelength (nm) |
|---|---|---|---|---|---|---|
| Example 19 | 0.10 | 0.858 | 3.34 | 0.350 | 4.92 | 622 |
| Example 20 | 0.11 | 0.935 | 3.41 | 0.418 | 5.18 | 631 |
| Example 21 | 0.15 | 0.911 | 3.70 | 0.272 | 5.63 | 642 |
| Example 22 | 0.08 | 0.680 | 2.54 | 0.332 | 4.29 | 616 |
| Example 23 | 0.09 | 0.680 | 2.54 | 0.332 | 4.29 | 616 |
| Example 24 | 0.10 | 0.858 | 3.34 | 0.350 | 4.92 | 622 |
| Comparative Example 8 | 0.10 | 0.858 | 3.34 | 0.350 | 4.92 | 622 |

The method for manufacturing the light emitting device of Example 19 will be described below with reference to FIG. 11 and FIG. 14.

The InGaN compound semiconductor was used as the active layer, and 16 blue LED chips 12 (FIG. 14) in which p-side/n-side electrodes were formed were prepared. The blue LED chip 12 is fixed to each of the plural recesses 46 of the flat-type mounting board 10 that is the stacked board of the patterned Cu metal and the insulating layer by using Sn—Ag—Cu paste. The patterned Cu metal constitutes the lead electrode.

As illustrated in FIG. 21, similarly to Example 13, the fixed LED chips 12 are connected so as to become the 4-by-4 array, and the anode electrode 60 and the cathode electrode 62 are formed. At this point, the lead electrode on the anode side and the p-side electrode of the blue LED chip 12 are electrically connected by the Au wire 14 (FIG. 13), and the lead electrode on the cathode side and the n-side electrode of the blue LED chip 12 are electrically connected through Sn—Ag—Cu paste. Then, the LED chips 12 are sealed by applying the silicone resin, thereby protecting the Au wire 14.

On the other hand, the silicone thin-film resin sheet 50 is loaded on the molding apparatus. In the resin sheet 50, the region where the LED chips 12 are located is transparent, and the reflection layer 52 in which Ag fine particles are dispersed is formed in other portions. The resin sheet 50 has the thickness of 0.1 mm, and the bonding agent is applied to only one side of the resin sheet 50.

Using the square die 42 having the size of 25 mm to 30 mm and the depth of 0.3 mm to 1.0 mm, the silicone transparent resin 26 is formed into the flat shape on the resin sheet 50 through the first-time molding process while the silicone transparent resin 26 is defoamed. Then, the resin sheet 50 in which the transparent resin 26 is formed is cured by retaining the resin sheet 50 at 150° C. for 30 minutes, thereby forming the transparent resin layer 16.

Then, at the silicone resin which is the binder resin, using the die 44 whose opening diameter is slightly larger and deeper than that of the first-time molding process, the resin 32 in which the red phosphors illustrated in the field of Example 19 of TABLE 13 are dispersed is formed into the flat shape with the even thickness through the second-time molding process such that the whole of the flat transparent resin layer 16 formed through the first-time molding process is covered with the resin 32. Then, the resin sheet 50 is cured by retaining the resin sheet 50 at 150° C. for 30 minutes at normal pressure in the atmosphere, thereby forming the first fluorescent layer 18.

Then, using the die whose opening diameter is slightly larger and deeper than that of the second-time molding process, the resin in which the green phosphors illustrated in the field of Example 19 of TABLE 12 are dispersed is formed into the flat shape with the even thickness through the third-time molding process such that the whole of the flat first fluorescent layer 18 formed through the second-time molding process is covered with the resin. Then, the resin sheet 50 is cured by retaining the resin sheet 50 at 150° C. for 30 minutes at normal pressure in the atmosphere, thereby forming the second fluorescent layer 20. Therefore, the stacked structure including the transparent resin layer 16, the first fluorescent layer 18, and the second fluorescent layer 20 becomes the flat shape.

Then, using the die whose opening diameter is slightly larger and deeper than that of the third-time molding process, the silicone transparent resin is formed with the even thickness through the fourth-time molding process such that the second fluorescent layer 20 applied through the third-time molding process is covered with the silicone transparent resin. The transparent resin is formed through the fourth-time molding process such that the ratio (=a/b) of the layer thickness a in the direction immediately above the LED chip and the layer thickness b in the lateral direction becomes 1.0.

Then, the transparent resin applied through the fourth-time molding process is cured by retaining the transparent resin at 150° C. for 30 minutes, and drying at normal pressure whereby the transparent resin layer 22 is formed to prepare the phosphor application sheet having the multi-layer structure. Therefore, the stacked structure including the transparent resin layer 16, the first fluorescent layer 18, the second fluorescent layer 20, and the transparent resin layer 22 becomes the flat shape.

After the residual atmosphere is removed in the reduced-pressure chamber, the phosphor application sheet (resin sheet) is bonded to the flat-type mounting board 10 to prepare the light emitting device illustrated in FIG. 11.

Examples 20 to 24

The light emitting devices were produced in the way similar to that of Example 19 except that the green phosphors having the compositions, peak wavelengths, and average particle diameters, which are illustrated in fields of Examples 20 to 24 of TABLE 12, were applied to the second fluorescent layer and except that the red phosphors having the compositions and peak wavelengths, which are illustrated in fields of Examples 20 to 24 of TABLE 13, were applied to the first fluorescent layer. The evaluations similar to that of Example 19 were performed. TABLE 14 illustrates the result.

Comparative Example 8

The light emitting devices were produced in the way similar to that of Example 19 except that the green phosphors having the compositions, peak wavelengths, and average particle diameters, which are illustrated in fields of Comparative example 8 of TABLE 12, were applied to the second fluorescent layer and except that the red phosphors having the compositions and peak wavelengths, which are illustrated in fields of Comparative example 8 of TABLE 13, were applied to the first fluorescent layer. The evaluations similar to that of Example 19 were performed. TABLE 14 illustrates the result.

It was confirmed that Examples 19 to 24 having the average particle diameter of 12 μm or more are higher than Comparative example 8 in the luminous flux. The high-luminance flat-type light emitting devices were obtained by Examples 19 to 24. When a continuous lighting test was performed while the light emitting devices of Examples 19 to 24 were joined to heat sinks, the decrease in luminous flux caused by heat accumulation was able to be suppressed. Accordingly, the light emitting devices of Examples 19 to 24 had the small color shift, high luminance, high efficiency, and excellent heat-radiation performance.

TABLE 14

| | Total Luminous Flux (Normalized) |
|---|---|
| Example 19 | 95 |
| Example 20 | 94 |
| Example 21 | 96 |
| Example 22 | 94 |
| Example 23 | 100 |
| Example 24 | 86 |
| Comparative Example 8 | 59 |

Comparative Examples 9 to 11

The light emitting device of the sixth embodiment illustrated in FIG. 11 was to be produced by adopting the method for manufacturing the light emitting device of the eighth embodiment illustrated in FIG. 14. At this point, the green phosphor having the composition, peak wavelength, and average particle diameter, which are illustrated in the fields of Comparative Examples 9 to 11 of TABLE 15, was applied to the second fluorescent layer. The red phosphor having the composition and peak wavelength, which are illustrated in the fields of Comparative Examples 9 to 11 of TABLE 16, was applied to the first fluorescent layer.

TABLE 15 illustrates values of x1, y, z, u, and w in the equation (1). TABLE 16 illustrates values of x2, a, b, c, and d in the equation (2).

The phosphors of Comparative examples 9 and 10 do not satisfy the conditions of the equations (1) and (2), although Comparative examples 9 and 10 are made based on the sialon compounds. Comparative example 11 of TABLE 16 is not made based on the sialon compound.

TABLE 15

| | x1 | y | z | u | w | Peak Wavelength (nm) |
|---|---|---|---|---|---|---|
| Comparative Example 9 | 0.08 | 0.03 | 1.46 | 2.99 | 4.15 | Weak emission |
| Comparative Example 10 | 0.08 | −0.105 | 0.05 | 3.12 | 3.96 | Weak emission |
| Comparative Example 11 | 0.10 | −0.37 | −0.35 | 2.64 | 3.81 | Weak emission |

TABLE 16

|  | X2 | a | b | c | d | Peak Wavelength (nm) |
|---|---|---|---|---|---|---|
| Comparative Example 9 | 0.50 | 0.350 | 4.61 | 0.613 | 2.23 | Weak emission |
| Comparative Example 10 | 0.14 | 1.12 | 1.35 | 0.580 | 6.34 | Weak emission |
| Comparative Example 11 | 0.015 | 0.94 | 1.02 | 0.25 | 2.72 | Different crystal structure |

As illustrated in TABLES 15 and 16, because the light emission is weak and insufficient for manufacturing the light emitting device in any phosphor, the light emitting device was not produced using the phosphors illustrated in TABLES 15 and 16.

Examples 25 to 29

The light emitting devices were produced in the way similar to that of Example 1 except that the green phosphors having the compositions, peak wavelengths, and average particle diameters, which are illustrated in fields of Examples 25 to 29 of TABLE 17, were applied to the second fluorescent layer and except that the red phosphors having the compositions and peak wavelengths, which are illustrated in fields of Examples 25 to 29 of TABLE 18, were applied to the first fluorescent layer. The evaluations similar to that of Example 1 were performed. TABLE 19 illustrates the result.

Comparative Examples 12, 13

The light emitting devices were produced in the way similar to that of Example 1 except that the green phosphors having the compositions, peak wavelengths, and average particle diameters, which are illustrated in fields of Comparative Examples 12, 13 of TABLE 17, were applied to the second fluorescent layer and except that the red phosphors having the compositions and peak wavelengths, which are illustrated in fields of Comparative Examples 12, 13 of TABLE 18, were applied to the first fluorescent layer. The evaluations similar to that of Example 1 were performed. TABLE 19 illustrates the result.

TABLE 17

|  | x1 | y | z | u | w | Peak Wavelength (nm) | Average Particle Diameter (μm) |
|---|---|---|---|---|---|---|---|
| Example 25 | 0.018 | −0.09 | −0.96 | −0.55 | 0.62 | 519 | 30 |
| Example 26 | 0.018 | −0.12 | −1.24 | −0.71 | −0.63 | 519 | 54 |
| Example 27 | 0.016 | −0.14 | −1.46 | −0.92 | −0.47 | 521 | 52 |
| Example 28 | 0.025 | −0.10 | −1.21 | −0.71 | −0.74 | 521 | 51 |
| Example 29 | 0.025 | −0.10 | −1.21 | −0.71 | −0.74 | 521 | 51 |
| Comparative Example 12 | 0.1 | −0.08 | 0.11 | −0.04 | 1.43 | 524 | 5 |
| Comparative Example 13 | 0.1 | −0.08 | 0.11 | −0.04 | 1.43 | 524 | 10 |

TABLE 18

|  | x2 | a | b | c | d | Peak Wavelength (nm) |
|---|---|---|---|---|---|---|
| Example 25 | 0.05 | 1.84 | 2.36 | 0.16 | 4.48 | 641 |
| Example 26 | 0.05 | 1.89 | 2.33 | 0.17 | 4.48 | 636 |
| Example 27 | 0.037 | 1.88 | 2.64 | 0.16 | 4.86 | 634 |
| Example 28 | 0.036 | 1.79 | 2.32 | 0.16 | 4.41 | 632 |
| Example 29 | 0.038 | 1.90 | 2.60 | 0.19 | 4.86 | 630 |
| Comparative Example 12 | 0.10 | 0.86 | 3.34 | 0.35 | 4.92 | 622 |
| Comparative Example 13 | 0.10 | 0.86 | 3.34 | 0.35 | 4.92 | 622 |

It was confirmed that Examples 25 to 29 having the average particle diameter of 12 μm or more are higher than Comparative examples 12, 13 in the luminous flux. The high-luminance flat-type light emitting devices were obtained by Examples 25 to 29. When a continuous lighting test was performed while the light emitting devices of Examples 25 to 29 were joined to heat sinks, the decrease in luminous flux caused by heat accumulation was able to be suppressed. Accordingly, the light emitting devices of Examples had the small color shift, high luminance, high efficiency, and excellent heat-radiation performance. Especially, because the light emitting devices of Examples 25 to 29 had improvement in material compositions, they realized less decrease in luminous flux caused by heat accumulation and better temperature dependency of characteristics compared to the devices of Comparative examples 12, 13.

TABLE 19

|  | Total Luminous Flux (Normalized) |
|---|---|
| Example 25 | 89 |
| Example 26 | 92 |
| Example 27 | 99 |
| Example 28 | 97 |
| Example 29 | 100 |
| Comparative Example 12 | 62 |
| Comparative Example 13 | 75 |

What is claimed is:

1. A light emitting device comprising:
a light emitting element emitting light having a wavelength of 250 nm to 500 nm; and
a green fluorescent layer disposed on the light emitting element, the green fluorescent layer including phosphor particles and resin, the phosphor particles being dispersed in the resin, the phosphor particles having an average particle diameter of 12 μm or more, the phosphor particles being plate-shaped particles having two side planes facing each other, the phosphor particles having a composition expressed by the following equation (1), $$(M_{1-x1}Eu_{x1})_{3-y}Si_{13-z}Al_{3+z}O_{2+u}N_{21-w} \quad (1)$$

wherein in the equation (1), M is an element selected from IA group elements, IIA group elements, IIIA group elements, IIIB group elements except Al, rare-earth elements, and IVB group elements, and x1, y, z, u, and w satisfy the following inequalities simultaneously, such that each of the following inequalities is satisfied by the choice of values of the identified paramaters within the noted ranges:

$0<x1<1$,
$-0.1<y<0.3$,
$-3<z≤1$,
$-3<u-w≤1.5$),
$-2<u$,
$w<21$.

2. The device according to claim 1, wherein the average particle diameter is not lower than 20 μm.

3. The device according to claim 1, wherein the average particle diameter is not lower than 50 μm.

4. The device according to claim 1, wherein the element M is Sr (strontium) or Sr and Ca (Calcium).

5. The device according to claim 1, further comprising a red fluorescent layer disposed between the light emitting element and the green fluorescent layer, the red fluorescent layer including phosphor particles having a composition expressed by the following equation (2), $$(M'_{1-x2}Eu_{x2})_a Si_b AlO_c N_d \quad (2)$$

wherein in the equation (2), M' is an element that is selected from IA group elements, IIA group elements, IIIA group elements, IIIB group elements except Al, rare-earth elements, and IVB group elements, and x2, a, b, c, and d satisfy the following relationship simultaneously, such that each of the following inequalities is satisfied by the choice of values of the identified paramaters within the noted ranges:

$0<x2<1$,
$0.55<a<0.95$,
$2.0<b<3.9$,
$0<c<0.6$,
$4<d<5.7$.

6. The device according to claim 5, wherein the element M and the element M' are Sr (strontium) or Sr and Ca (Calcium).

* * * * *